(12) United States Patent
Saito et al.

(10) Patent No.: US 9,007,813 B2
(45) Date of Patent: Apr. 14, 2015

(54) SEMICONDUCTOR DEVICE

(71) Applicant: Semiconductor Energy Laboratory Co., Ltd., Atsugi-shi, Kanagawa-ken (JP)

(72) Inventors: Toshihiko Saito, Atsugi (JP); Takanori Matsuzaki, Atsugi (JP); Shuhei Nagatsuka, Atsugi (JP); Hiroki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 13/795,244

(22) Filed: Mar. 12, 2013

(65) Prior Publication Data

US 2013/0181216 A1    Jul. 18, 2013

Related U.S. Application Data

(63) Continuation of application No. 13/094,863, filed on Apr. 27, 2011, now Pat. No. 8,406,038.

(30) Foreign Application Priority Data

May 14, 2010 (JP) ................. 2010-111939

(51) Int. Cl.
*G11C 11/24* (2006.01)
*H01L 29/78* (2006.01)
(Continued)

(52) U.S. Cl.
CPC .............. *H01L 29/78* (2013.01); *G11C 11/403* (2013.01); *G11C 11/406* (2013.01);
(Continued)

(58) Field of Classification Search
USPC ........ 365/149, 189.03, 222; 257/43, E29.296
See application file for complete search history.

(56) References Cited

U.S. PATENT DOCUMENTS 4,466,081 A    8/1984  Masuoka
5,349,366 A    9/1994  Yamazaki et al.
(Continued)

FOREIGN PATENT DOCUMENTS

EP    1 737 044 A    12/2006
EP    2 226 847 A    9/2010
(Continued)

OTHER PUBLICATIONS

Ishii et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.
(Continued)

*Primary Examiner* — Vu Le
(74) *Attorney, Agent, or Firm* — Eric J. Robinson; Robinson Intellectual Property Law Office, P.C.

(57) ABSTRACT

A semiconductor device includes a plurality of memory cells including a first transistor and a second transistor, a reading circuit including an amplifier circuit and a switch element, and a refresh control circuit. A first channel formation region and a second channel formation region contain different materials as their respective main components. A first gate electrode is electrically connected to one of a second source electrode and a second drain electrode. The other of the second source electrode and the second drain electrode is electrically connected to one of input terminals of the amplifier circuit. An output terminal of the amplifier circuit is connected to the other of the second source electrode and the second drain electrode through the switch element. The refresh control circuit is configured to control whether the switch element is turned on or off.

21 Claims, 10 Drawing Sheets

(51) Int. Cl.
  *G11C 11/403* (2006.01)
  *G11C 11/406* (2006.01)
  *G11C 16/04* (2006.01)
  *H01L 27/115* (2006.01)
  *H01L 27/12* (2006.01)

(52) U.S. Cl.
  CPC ..... *G11C 16/0416* (2013.01); *H01L 27/11521* (2013.01); *H01L 27/1156* (2013.01); *H01L 27/1207* (2013.01); *H01L 27/1225* (2013.01); *G11C 2211/4065* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,327,210 B1 | 12/2001 | Kuroda et al. |
| 6,445,026 B1 | 9/2002 | Kubota et al. |
| 6,536,013 B2 | 3/2003 | Kobayashi et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,375,399 B2 | 5/2008 | Ishii et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,082 B2 | 9/2010 | Iwasaki |
| 7,859,889 B2 | 12/2010 | Kameshiro et al. |
| 7,884,360 B2 | 2/2011 | Takechi et al. |
| 7,888,207 B2 | 2/2011 | Wager, III et al. |
| 8,420,442 B2 | 4/2013 | Takechi et al. |
| 8,421,090 B2 | 4/2013 | Choi |
| 8,530,246 B2 | 9/2013 | Ofuji et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0123313 A1 | 7/2003 | Hanzawa et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0266088 A1* | 12/2004 | Luyken et al. ............... 438/202 |
| 2005/0017302 A1 | 1/2005 | Hoffman |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2011/0089417 A1 | 4/2011 | Yamazaki et al. |
| 2011/0210339 A1 | 9/2011 | Yamazaki et al. |
| 2012/0039126 A1 | 2/2012 | Saito |
| 2012/0069634 A1 | 3/2012 | Saito |
| 2013/0237012 A1 | 9/2013 | Takechi et al. |
| 2014/0167041 A1 | 6/2014 | Yamazaki et al. |

FOREIGN PATENT DOCUMENTS

| | | |
|---|---|---|
| EP | 2491585 A | 4/2011 |
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-125084 A | 5/1994 |
| JP | 07-211084 A | 8/1995 |

(56) References Cited

FOREIGN PATENT DOCUMENTS

| JP | 08-264794 A | 10/1996 |
|---|---|---|
| JP | 11-505377 | 5/1999 |
| JP | 11-233789 A | 8/1999 |
| JP | 2000-044236 A | 2/2000 |
| JP | 2000-150900 A | 5/2000 |
| JP | 2001-053164 | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-012878 A | 1/2006 |
| JP | 2006-502597 | 1/2006 |
| JP | 2008-042088 A | 2/2008 |
| JP | 2008-085048 A | 4/2008 |
| JP | 2008-287887 | 11/2008 |
| JP | 2009-009702 | 1/2009 |
| JP | 2009-135350 A | 6/2009 |
| JP | 2009-277702 A | 11/2009 |
| JP | 2010-003910 A | 1/2010 |
| JP | 2011-054936 A | 3/2011 |
| JP | 5586412 | 9/2014 |
| WO | WO-2004/038757 | 5/2004 |
| WO | WO 2004/114391 | 12/2004 |
| WO | WO-2009/139482 | 11/2009 |
| WO | WO-2011/048929 | 4/2011 |

OTHER PUBLICATIONS

Kim et al., "An Experimental High-Density DRAM Cell with a Built-in Gain Stage," IEEE Journal of Solid-State Circuits, Aug. 1, 1994, vol. 29, No. 8, pp. 978-981.

Shukuri et al., "A Complementary Gain Cell Technology for sub-1 V Supply DRAMs ," IEDM 92: Technical Digest of International Electron Devices Meeting, Dec. 13, 1992, pp. 1006-1008.

Shukuri et al., "A Semi-Static Complementary Gain Cell Technology for Sub-1 V Supply DRAM's," IEEE Transactions on Electron Devices, Jun. 1, 1994, vol. 41, No. 6, pp. 926-931.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using Cg-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$ = 3, 4, and 5), $InGaO_3(ZnO)_3$, and $Ga_2O_3(ZnO)_m$ ($m$ = 7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9th International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn—doped Zinc Indium Oxide Thin Film Transistors for AMOLED Back-Plane," SID Digest '09: SID International Symposium Digest of Technical Papers, May 31, 2009, pp. 280-283.

(56) References Cited

OTHER PUBLICATIONS

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

* cited by examiner

SEMICONDUCTOR DEVICE

BACKGROUND OF THE INVENTION

1. Field of the Invention

An embodiment of the invention disclosed herein relates to a semiconductor device including a semiconductor element and a manufacturing method of the semiconductor device.

2. Description of the Related Art

Memory devices including semiconductor elements are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a storage element is selected and electric charge is stored in a capacitor.

When data is read from a DRAM, electric charge in a capacitor is lost according to the above-described principle; thus, another write operation is necessary every time data is read out. Moreover, a transistor included in a memory element has leakage current (off-state current) between a source and a drain in an off state or the like and electric charge flows into or out of the transistor even if the transistor is not selected, which makes a data holding period short. For that reason, write operation (refresh operation) is necessary at short intervals, and it is difficult to sufficiently reduce power consumption. Furthermore, since stored data is lost when power supply stops, another memory device utilizing a magnetic material or an optical material is needed in order to hold the data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a problem in that a memory element becomes unable to function after a large number of repeated write operations because a gate insulating layer included in the memory element deteriorates due to tunneling current generated in the write operations. In order to alleviate this problem, a method in which the number of write operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In addition, high voltage is necessary in order to inject charge into the floating gate or removing the charge. Furthermore, a circuit for that purpose is required. Moreover, it takes a relatively long time to inject or remove electric charge, and it is not easy to increase the speed of writing or erasing data.

REFERENCE

[Patent Document 1] Japanese Published Patent Application No. S57-105889

SUMMARY OF THE INVENTION

In view of the foregoing problems, an object of one embodiment of the disclosed invention is to provide a semiconductor device with a novel structure where stored data can be held for a long time even when power is not supplied and where there is no limitation on the number of write cycles.

In one embodiment of the disclosed invention, a semiconductor device is formed using a material with which the off-state current of a transistor can be decreased, such as an oxide semiconductor. A transistor including an oxide semiconductor, particularly a purified oxide semiconductor, has an extremely small off-state current and thus can hold data for a long time. More specifically, the following structures can be employed, for example.

An embodiment of the disclosed invention is a semiconductor device which includes a plurality of memory cells including a first transistor and a second transistor, a reading circuit including an amplifier circuit and a switch element, and a refresh control circuit. The first transistor includes a first channel formation region, a first gate electrode, a first gate insulating layer between the first channel formation region and the first gate electrode, and a first source electrode and a first drain electrode electrically connected to the first channel formation region. The second transistor includes a second channel formation region, a second gate electrode, a second gate insulating layer between the second channel formation region and the second gate electrode, and a second source electrode and a second drain electrode electrically connected to the second channel formation region. The first channel formation region and the second channel formation region contain different materials as their respective main components. The first gate electrode is electrically connected to one of the second source electrode and the second drain electrode. The other of the second source electrode and the second drain electrode is electrically connected to one of input terminals of the amplifier circuit. An output terminal of the amplifier circuit is connected to the other of the second source electrode and the second drain electrode through the switch element. The refresh control circuit is configured to control whether the switch element is turned on or off.

The above semiconductor device may include a capacitor electrically connected to the first gate electrode. The refresh control circuit may have a function to turn on the switch element in accordance with the refresh timing for the memory cells. The refresh timing may be at a frequency of once every $10^3$ or more seconds per memory cell (in other words, the refreshing may occur every $10^3$ or more seconds).

In the above semiconductor device, the second channel formation region may contain a material having a wider band gap than a material contained in the first channel formation region. The first channel formation region may contain a material capable of increasing operation speed, and the second channel formation region may contain a material capable of decreasing off-state current. For example, in the above semiconductor device, the first channel formation region may include silicon as a main component, and the second channel formation region may contain an In—Ga—Zn—O-based oxide material.

Note that the term "main component" used in this specification and the like refers to a component whose content is the highest (at. %). For example, it can be said that the main component of a so-called silicon wafer is silicon.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Moreover, the terms such as "over" and "below" are used simply for convenience of explanation.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

A semiconductor device according to one embodiment of the present invention does not require high voltage for writing data, and degradation of the element does not become a problem. For example, since there is no need to perform injection of electrons to a floating gate and extraction of electrons from the floating gate which are needed in a conventional nonvolatile memory, deterioration of a gate insulating layer does not occur. That is, the semiconductor device according to one embodiment of the present invention does not have a limit on the number of rewriting, which has been a problem of a conventional nonvolatile memory, and thus has significantly improved reliability. Furthermore, since data is written by turning on or off the transistor, high-speed operation can be easily realized. In addition, there is no need of operation for erasing data.

In particular, by forming the first channel formation region and the second channel formation region using different materials as their respective main components, a semiconductor device having highly excellent characteristics can be realized. For example, by using a material capable of increasing operation speed for the first channel formation region and using a material capable of decreasing off-state current for the second channel formation region, a semiconductor device having an unprecedented feature can be realized.

DETAILED DESCRIPTION OF THE INVENTION

Figure 1A:
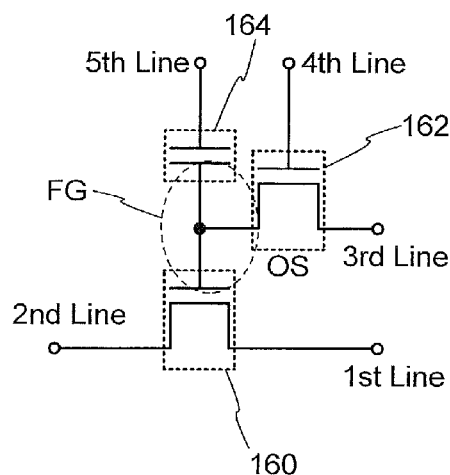
FIGS. 1A to 1C are circuit diagrams of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be interpreted as being limited to the description in the following embodiments.

Note that the position, size, range, or the like of each component illustrated in drawings and the like is not accurately represented in some cases for easy understanding. Therefore, the disclosed invention is not necessarily limited by the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a basic circuit configuration and an operation of a semiconductor device according to one embodiment of the disclosed invention will be described with reference to FIGS. 1A to 1C. Note that in some circuit diagrams, "OS" is written beside a transistor in order to indicate that the transistor includes an oxide semiconductor, but this does not mean that the transistor is limited to that which is formed using an oxide semiconductor.

In a semiconductor device illustrated in FIG. 1A, a first wiring (1st Line) is electrically connected to a source electrode of a transistor 160. A second wiring (2nd Line) is electrically connected to a drain electrode of the transistor 160. A gate electrode of the transistor 160 and one of a source electrode and a drain electrode of a transistor 162 are electrically connected to one electrode of a capacitor 164. A third wiring (3rd Line) is electrically connected to the other of the source electrode and the drain electrode of the transistor 162. A fourth wiring (4th Line) is electrically connected to a gate electrode of the transistor 162. A fifth wiring (5th Line) is electrically connected to the other electrode of the capacitor 164.

Here, for example, a transistor including an oxide semiconductor is used as the transistor 162. A transistor including an oxide semiconductor, particularly a purified oxide semiconductor, has a characteristic of a significantly small off-state current. For that reason, a potential of the gate electrode of the transistor 160 can be held for an extremely long period by turning off the transistor 162. By providing the capacitor 164, holding of charge applied to the gate electrode of the transistor 160 and reading of data held can be performed more easily.

Note that there is no particular limitation on the structure of the transistor 160 and the like. In terms of increasing the speed of reading data, it is preferable to use a transistor with high switching speed such as a transistor formed using single crystal silicon, for example.

Figure 1C:
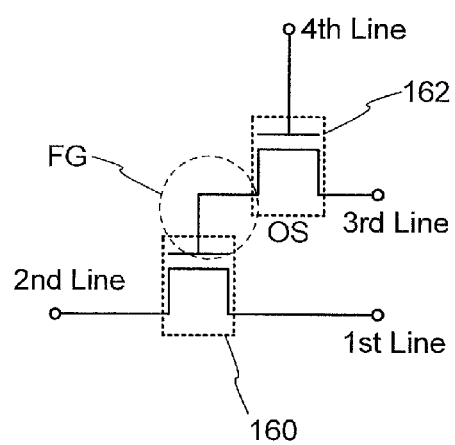

Alternatively, a structure in which the capacitor 164 is not provided is also possible as illustrated in FIG. 1C.

The semiconductor device in FIG. 1A or the like utilizes a characteristic in which the potential of the gate electrode of the transistor 160 can be held, and can thus write, hold, and read data as follows.

First of all, writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potentials (hereinafter, a charge providing a low potential is referred to as charge $Q_L$ and a charge providing a high potential is referred to as charge $Q_H$) is applied through the third wiring. Note that charges providing three or more different potentials may be applied to improve storage capacity.

After that, the potential of the fourth wiring is set to a potential at which the transistor 162 is turned off, so that the transistor 162 is turned off. Thus, the charge supplied to the gate electrode of the transistor 160 is held (holding). Since the off-state current of the transistor 162 is significantly small, the charge of the gate electrode of the transistor 160 is held for a long time.

Next, reading of data will be described. When an appropriate potential (a reading potential) is supplied to the fifth wiring while a predetermined potential (a constant potential) is supplied to the first wiring, the potential of the second wiring varies depending on the amount of charge held at the gate electrode of the transistor 160. This is because, in general, when the transistor 160 is an n-channel transistor, an apparent threshold voltage $V_{th\_H}$ in the case where $Q_H$ is supplied to the gate electrode of the transistor 160 is lower than an apparent threshold voltage $V_{th\_L}$ in the case where $Q_L$ is supplied to the gate electrode of the transistor 160. Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge supplied to the gate electrode of the transistor 160 can be determined. For example, in the case where $Q_H$ is supplied in writing, when the potential of the fifth wiring is $V_0$ ($>V_{th\_H}$), the transistor 160 is turned on. In the case where $Q_L$ is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed to be used, it is necessary that data of only a desired memory cell can be read. In order to read data of a predetermined memory cell and not to read data of the other memory cells, in the case where the transistors 160 of the memory cells are connected in parallel, fifth wirings in memory cells that are not a target for reading are supplied with a potential at which the transistors 160 are turned off regardless of the state of the gate electrodes, that is, a potential lower than $V_{th\_H}$. On the other hand, in the case where the transistors 160 of the memory cells are connected in series, fifth wirings in memory cells that are not a target for reading are supplied with a potential at which the transistors 160 are turned on regardless of the state of the gate electrodes, that is, a potential higher than $V_{th\_L}$. It can be determined whether to supply a potential at which the transistors 160 are turned on or a potential at which the transistors 160 are turned off in the memory cells that are not a target for reading, depending on the connection relationship of the memory cells (e.g., depending on whether the memory cells are connected in series or in parallel).

Next, rewriting of data will be described. Rewriting of data is performed in a manner similar to that of the writing and holding of data. That is, the potential of the fourth wiring is set to a potential at which the transistor 162 is turned on, so that the transistor 162 is turned on. Accordingly, the potential of the third wiring (a potential for new data) is supplied to the gate electrode of the transistor 160 and to the capacitor 164. After that, the potential of the fourth wiring is set to a potential at which the transistor 162 is turned off, so that the transistor 162 is turned off. Accordingly, charge for new data is held at the gate electrode of the transistor 160.

In the semiconductor device according to one embodiment of the disclosed invention, data can be directly rewritten by overwriting data as described above. Therefore, extraction of charge from a floating gate with the use of a high voltage which is necessary for a flash memory or the like is not needed, and thus a decrease in operation speed due to erase operation can be suppressed. In other words, high-speed operation of the semiconductor device can be realized. Further, in that case, the problem of deterioration of a gate insulating film (tunnel insulating film), which is a problem of a conventional floating gate transistor, does not exist. That is, the problem of deterioration of a gate insulating film due to injection of electrons into a floating gate, which is a conventional problem, can be solved. This means that there is no limit on the number of write cycles in principle.

Note that the source electrode or the drain electrode of the transistor 162 is electrically connected to the gate electrode of the transistor 160 and therefore has a function similar to that of a floating gate of a floating gate transistor used for a nonvolatile memory element. Therefore, in drawings, a portion where the source electrode or the drain electrode of the transistor 162 is electrically connected to the gate electrode of the transistor 160 is called a node FG in some cases. When the transistor 162 is turned off, the node FG can be regarded as being embedded in an insulator and thus charge is held at the node FG. The off-state current of the transistor 162 including an oxide semiconductor is smaller than or equal to 1/100000 of the off-state current of a transistor including a silicon semiconductor or the like; thus, loss of the charge accumulated in the node FG due to leakage in the transistor 162 is negligible. That is, with the transistor 162 including an oxide semiconductor, a substantially nonvolatile memory device which can store data without being supplied with power can be realized.

For example, when the off-state current of the transistor 162 at room temperature (25° C.) is 10 zA (1 zA (zeptoampere) is $1\times10^{-21}$ A) or less and the capacitance of the capacitor 164 is approximately 10 fF, data can be held for $10^4$ seconds or longer. It is needless to say that the holding time depends on transistor characteristics and capacitance.

Figure 1B:
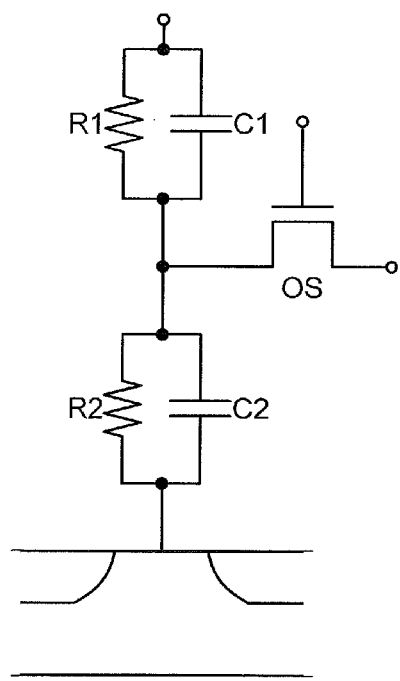

Components such as transistors in the semiconductor device in FIG. 1A can be regarded as including resistors and capacitors as illustrated in FIG. 1B. In FIG. 1B, the transistor 160 and the capacitor 164 are each regarded as including a resistor and a capacitor. R1 and C1 denote the resistance and the capacitance of the capacitor 164, respectively. The resistance R1 corresponds to the resistance of the insulating layer included in the capacitor 164. R2 and C2 denote the resistance and the capacitance of the transistor 160, respectively. The resistance R2 corresponds to the resistance of the gate insulating layer at the time when the transistor 160 is turned on. The capacitance C2 corresponds to a so-called gate capacitance (capacitance formed between the gate electrode and the source or drain electrode, and capacitance formed between the gate electrode and the channel formation region).

A charge holding period (also referred to as a data holding period) is determined mainly by the off-state current of the transistor 162 under the conditions where the gate leakage current of the transistor 162 is sufficiently small and R1 and R2 satisfy R1≥ROS and R2≥ROS, where ROS is the resistance (also referred to as effective resistance) between the source electrode and the drain electrode in a state where the transistor 162 is turned off.

On the other hand, in the case where the above conditions are not satisfied, it is difficult to secure a sufficient holding period even if the off-state current of the transistor 162 is sufficiently small. This is because a leakage current other than the off-state current of the transistor 162 (e.g., a leakage current generated between the source electrode and the gate electrode of the transistor 160) is large. Accordingly, it can be said that the semiconductor device disclosed in this embodiment preferably satisfies the above relationships.

Meanwhile, it is desirable that C1 and C2 satisfy C1≥C2. This is because if C1 is large, when the potential of the node FG is controlled by the fifth wiring, the potential of the fifth wiring can be efficiently supplied to the node FG and the difference between potentials supplied to the fifth wiring (e.g., a reading potential and a non-reading potential) can be kept small.

When the above relationships are satisfied, a more favorable semiconductor device can be realized. Note that R1 and R2 depend on the gate insulating layer of the transistor 160 and the insulating layer of the capacitor 164. The same applies to C1 and C2. Therefore, the material, the thickness, and the like of the gate insulating layer are preferably set as appropriate to satisfy the above relationships.

In the semiconductor device described in this embodiment, the node FG has a function similar to a floating gate of a floating gate transistor of a flash memory or the like, but the node FG of this embodiment has a feature which is essentially different from that of the floating gate of the flash memory or the like. In the case of a flash memory, since a high voltage is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. That is, a high electric field for charge injection is not necessary, unlike a flash memory. Accordingly, it is not necessary to consider an influence of a high electric field from a control gate on an adjacent cell, and this facilitates higher integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where two-level (one-bit) data is written.

Note that in addition to the increase in the degree of integration, a multilevel technique can be employed to increase the storage capacity of the semiconductor device. For example, three or more levels of data are written to one memory cell, whereby the storage capacity can be increased as compared to the case where two-level data is written. The multilevel technique can be achieved by, for example, supplying charge Q providing a potential to the gate electrode of the transistor 160, in addition to charge $Q_L$ providing a low potential and charge $Q_H$ providing a high potential as described above. In this case, enough storage capacity can be ensured even in a circuit structure where the area occupied by a memory cell cannot be sufficiently decreased.

Note that an n-type transistor (n-channel transistor) in which electrons are majority carriers is used in the above description; it is needless to say that a p-type transistor (p-channel transistor) in which holes are majority carriers can be used instead of the n-type transistor.

The structures, methods, and the like described in this embodiment can be combined as appropriate with any of the structures, methods, and the like described in the other embodiments.

Embodiment 2

In this embodiment, an example of application of the semiconductor device described in the above embodiment will be described. Specifically, an example of a semiconductor device including a plurality of semiconductor devices described in the above embodiment will be described with reference to FIGS. 2A and 2B, FIG. 3, and FIGS. 4A to 4C.
<Circuit Configuration of Semiconductor Device>

Figure 2A:
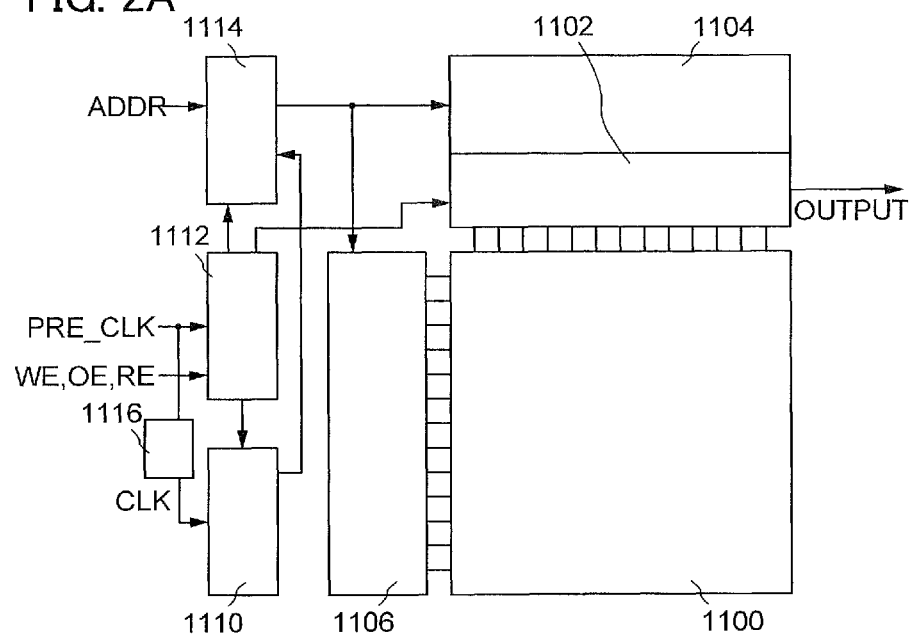
FIGS. 2A and 2B are circuit diagrams of a semiconductor device.
Figure 2B:
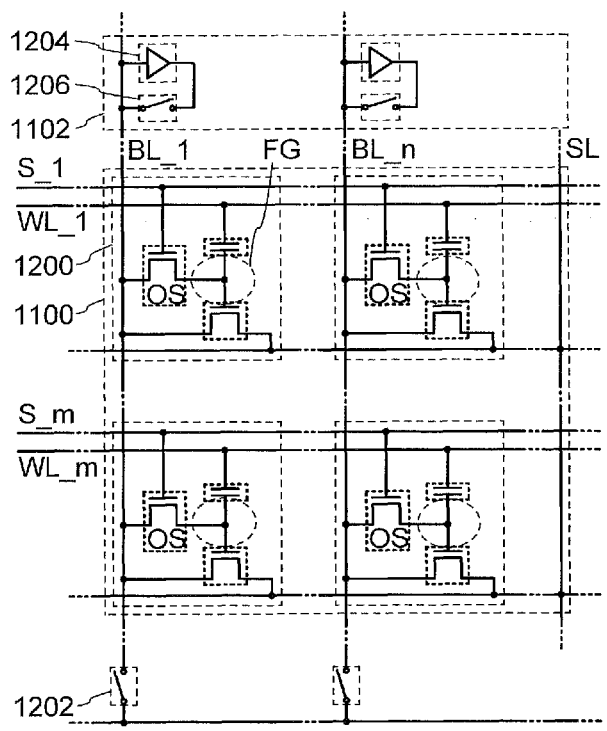

FIGS. 2A and 2B illustrate an example of a semiconductor device where m×n semiconductor devices each corresponding to FIG. 1A are arranged. FIG. 2A is a block diagram of the semiconductor device, and FIG. 2B is a diagram illustrating part of FIG. 2A in detail.

The semiconductor device according to one embodiment of the present invention includes a memory cell array 1100, a reading circuit 1102, a first driver circuit 1104, a second driver circuit 1106, a refresh control circuit 1110, a command control circuit 1112, an address control circuit 1114, and a divider circuit 1116 (see FIG. 2A). Note that this configuration is merely an example, and the disclosed invention should not be construed as being limited to this example. For example, only one driver circuit may be provided, or three or more driver circuits may be provided.

The memory cell array 1100 is a data storage region. The reading circuit 1102 is electrically connected to the memory cell array 1100 and functions to read data from the memory cell array 1100 and output the data as a data signal OUTPUT to the outside. The reading circuit 1102 also functions to refresh the memory cell array 1100. The first driver circuit 1104 is electrically connected to the memory cell array 1100 through the reading circuit 1102, and the second driver circuit 1106 is electrically connected to the memory cell array 1100. The command control circuit 1112 outputs a signal based on a first clock signal PRE_CLK, a write enable signal WE, and an output enable signal OE to the reading circuit 1102, the refresh control circuit 1110, the address control circuit 1114, and the like. The divider circuit 1116 supplies a second clock signal CLK based on the first clock signal PRE_CLK to the refresh control circuit 1110. The refresh control circuit 1110 supplies a signal related to refresh timing, which is based on the signal from the command control circuit 1112 and the second clock signal CLK from the divider circuit 1116, to the address control circuit 1114. The address control circuit 1114 supplies a signal based on the signal from the refresh control circuit 1110, the signal from the command control circuit 1112, and the address signal ADDR to the first driver circuit 1104 and the second driver circuit 1106. Then, in accordance with that signal, the first driver circuit 1104 and the second driver circuit 1106 specify an address for data writing, reading, and the like.

The memory cell array 1100 is a memory cell array with m rows and n columns and includes semiconductor devices each corresponding to FIG. 1A (hereinafter, memory cells 1200), m signal lines (signal lines S_1 to S_m), m word lines (word lines WL_1 to WL_m), n bit lines (bit lines BL_1 to BL_n), and a source line SL (see FIG. 2B). That is, there are m×n memory cells 1200. Note that each of the n bit lines is connected to a switch element 1202. That is, there are n switch elements 1202.

Each of the memory cells 1200 includes a first transistor, a second transistor, and a capacitor. In each of the memory cells 1200, a gate electrode of the first transistor, one of a source electrode and a drain electrode of the second transistor, and one of electrodes of the capacitor are electrically connected to each other, and the source line and a source electrode (a source region) of the first transistor are electrically connected to each other. Furthermore, the bit line, the other of the source electrode and the drain electrode of the second transistor, and a drain electrode of the first transistor are electrically connected to each other. The word line and the other of the electrodes of the capacitor are electrically connected to each other. The signal line and the gate electrode of the second transistor are electrically connected to each other. In other words, the source line corresponds to the first wiring (1st Line) in the configuration illustrated in FIG. 1A; the bit line, the second wiring (2nd Line) and the third wiring (3rd Line); the signal line, the fourth wiring (4th Line); and the word line, the fifth wiring (5th Line). Note that this configuration is merely an example, and the disclosed invention should not be construed as being limited to this example. For example, wirings may double as each other unless the operation of the semiconductor device is interfered with. Alternatively, the wirings may be separate without doubling.

The reading circuit 1102 includes n amplifier circuits 1204 and n switch elements 1206 (see FIG. 2B). Here, one of input terminals of each of the amplifier circuits 1204 is electrically connected to the corresponding bit line, and an output terminal of each of the amplifier circuits 1204 is electrically connected to the bit line through the switch element 1206. That is, one of input terminals of each of the amplifier circuits 1204 is electrically connected to the other of the source electrode and the drain electrode of the second transistor, and the output terminal of each of the amplifier circuits 1204 is connected to the other of the source electrode and the drain electrode of the second transistor through the switch element 1206. The other of the input terminals of each of the amplifier circuits 1204 is connected to a reference power supply line (not illustrated). With the reading circuit 1102 as described above, it is possible to perform refresh operation of the memory cells 1200. In other words, by turning on the switch element 1206, the potential of the bit line can be amplified by the amplifier circuit 1204 and then supplied again to the bit line.

Figure 3:
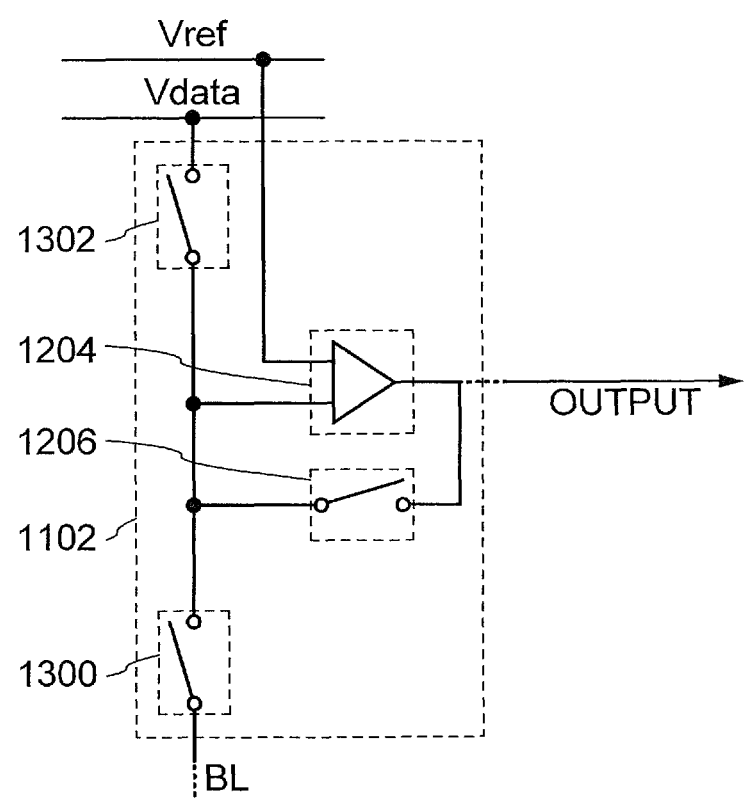
FIG. 3 is a circuit diagram of a semiconductor device.

Details of the above reading circuit 1102 are illustrated in FIG. 3. The bit line BL is connected to one of input terminals of the amplifier circuit 1204 through a switch element 1300 which is controlled by a read enable signal RE. The data line supplied with a potential Vdata is connected to the input terminal of the amplifier circuit 1204 through a switch element 1302 which is controlled by the write enable signal WE. The other of the input terminals of the amplifier circuit 1204 is electrically connected to a wiring which supplies a reference potential Vref. Note that this reading circuit is merely an example, and the configuration thereof can be modified as appropriate.

Figure 4A:
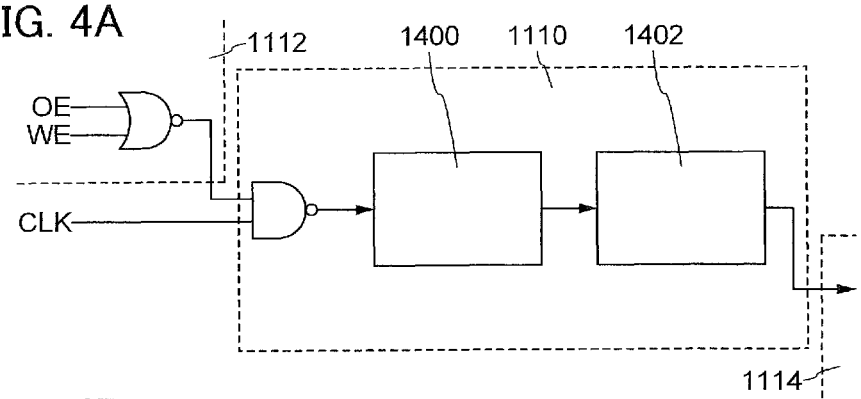
FIGS. 4A to 4C are circuit diagrams of a semiconductor device.
Figure 4B:
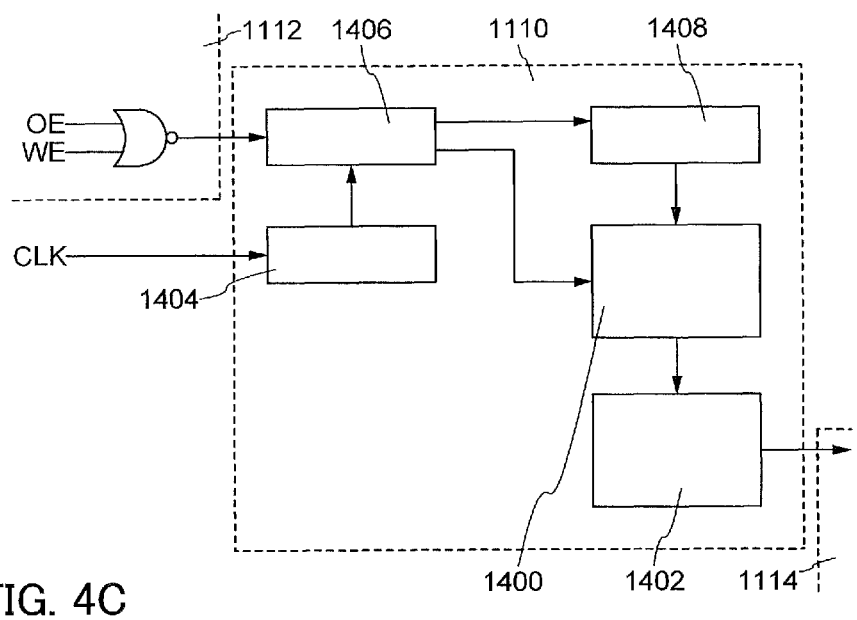
Figure 4C:
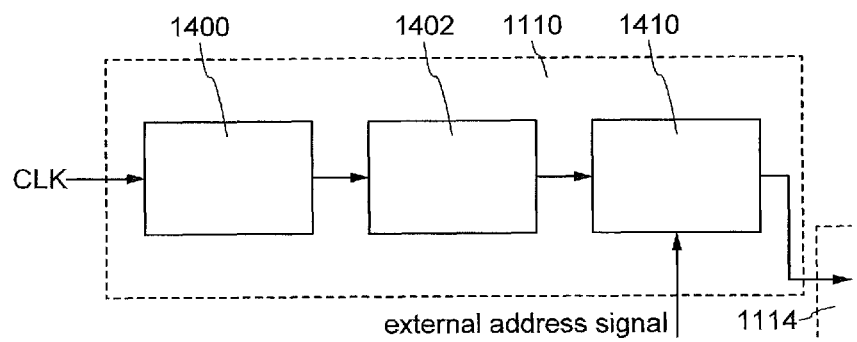

Details of the refresh control circuit 1110 and circuits related to the refresh control circuit 1110 are illustrated in FIGS. 4A to 4C.

FIG. 4A illustrates an example of the refresh control circuit 1110 and the like. The refresh control circuit 1110 illustrated in FIG. 4A includes a NAND circuit, a refresh count circuit 1400, and an address generation circuit 1402. The NAND circuit outputs the logical NAND of input signals, from the second clock signal CLK and the logical NOR of the write enable signal WE and the output enable signal OE. The refresh count circuit 1400 counts rows in accordance with the signal from the NAND circuit, and the address generation circuit 1402 generates an address signal based on data obtained by the counting in the refresh count circuit 1400 and outputs the address signal to the address control circuit 1114. In this configuration, in the case where the write enable signal WE and the output enable signal OE are inactive, the second clock signal CLK causes the refresh count circuit 1400 to operate, and a refresh operation is performed for each row. While the memory is being accessed, a refresh operation is not performed; thus, the interval between refresh operations tends to be long. However, there is no problem because the semiconductor device according to the disclosed invention can hold data for a long time.

FIG. 4B illustrates another example of the refresh control circuit 1110 and the like. The refresh control circuit 1110 illustrated in FIG. 4B includes a refresh count circuit 1400, an address generation circuit 1402, a frequency detection circuit 1404, a switching control circuit 1406, and a refresh clock generation circuit 1408. The frequency detection circuit 1404 is a circuit for determining whether or not the second clock signal CLK has a predetermined frequency, and a band-pass filter is typically used. The switching control circuit 1406 determines whether the second clock signal CLK is input directly to the refresh count circuit 1400 or input to the refresh clock generation circuit 1408, in accordance with the signal from the frequency detection circuit 1404. The refresh clock generation circuit 1408 generates, using an internal clock, a clock signal with a frequency necessary for refresh operation and outputs the clock signal to the refresh count circuit 1400. The functions of the refresh count circuit 1400 and the address generation circuit 1402 are similar to those in the configuration of FIG. 4A. In this configuration, it is determined whether or not the second clock signal CLK is suitable for refresh operation, and a clock signal with a frequency suitable for refresh operation is used. Therefore, even when the frequency of the second clock signal CLK varies, appropriate refresh operation can be performed.

FIG. 4C illustrates another example of the refresh control circuit 1110 and the like. The refresh control circuit 1110 illustrated in FIG. 4C includes a refresh count circuit 1400, an address generation circuit 1402, and a refresh address comparison control circuit 1410. The refresh address comparison control circuit 1410 compares an address signal generated by the address generation circuit 1402 with an external address signal (an address signal for specifying an address for writing or reading) and outputs the comparison result to the address control circuit 1114. In this configuration, refresh operation is performed when the address signal generated by the address generation circuit 1402 does not match the external address signal.

Note that the disclosed invention should not be construed as being limited to the above-described specific configurations of the refresh control circuit 1110 and the like.

<Operation 1 of Semiconductor Device>

Next, an example of write, read, and refresh operations of the above-described semiconductor device will be described. Note that the operation of the semiconductor device which includes a memory cell array with two rows and two columns is described here for easy understanding; the disclosed invention is not limited to this structure.

Writing data to the memory cell 1200 (1,1) in the first row and the first column and the memory cell 1200 (1,2) in the first row and the second column and reading data from the memory cell 1200 (1,1) in the first row and the first column and the memory cell 1200 (1,2) in the first row and the second column will be described. Note that data written to the memory cell 1200 (1,1) is "1" and data written to the memory cell 1200 (1,2) is "0" in the following description.

Writing will be described. First, a potential V1 is supplied to the signal line S_1 in the first row, whereby the second transistors in the first row are turned on. Further, a potential of 0 V is supplied to the signal line S_2 in the second row, whereby the second transistors in the second row are turned off. Further, a potential V2 is supplied to the bit line BL_1 in the first column, and the potential of 0 V is supplied to the bit line BL_2 in the second column. As a result, a potential V2 and a potential of 0 V are supplied to the node FG of the memory cell 1200 (1,1) and the node FG of the memory cell 1200 (1,2), respectively. When read operation is performed here, the potential V2 is set so as to generate a potential difference which is larger than the threshold voltage of the first transistor. It is preferable that the potential V2 be substantially equal to the potential V1 or lower than or equal to the potential V1.

Then, the potential of the signal line S_1 in the first row is set to 0 V, whereby the second transistors in the first row are turned off; thus, writing is completed. Note that the word line WL_1 in the first row and the word line WL_2 in the second row are at a potential of 0 V during the write operation. At the end of the write operation, before the potential of the bit line BL_1 in the first column is changed, the potential of the signal line S_1 in the first row is set to 0 V.

After the write operation, the threshold value of a memory cell is Vw0 in the case where data "0" has been written and Vw1 in the case where data "1" has been written. Here, the threshold value of the memory cell means the potential of the word line WL, which changes resistance between the source electrode and the drain electrode of the first transistor. Note that Vw0>0>Vw1 is satisfied here.

Next, the read operation will be described. The potential 0 V and the potential VL are supplied to the word line WL_1 in the first row and the word line WL_2 in the second row, respectively. The potential VL is lower than the threshold value Vw1. When the word line WL_1 is at a potential of 0 V, in the first row, the first transistor of the memory cell in which data "0" is held is turned off, and the first transistor of the memory cell in which data "1" is held is turned on. When the word line WL_2 is at the potential VL, in the second row, the first transistors of the memory cells in which either data "0" or data "1" is held are turned off.

As a result, the resistance between the bit line BL_1 and the source line SL is low because the first transistor in the memory cell 1200 (1,1) is on, and the resistance between the bit line BL_2 and the source line SL is high because the first transistor in the memory cell 1200 (1,2) is off. The reading circuit connected to the bit line BL_1 and the bit line BL_2 can read data on the basis of a difference in resistance among the bit lines.

Note that, during the read operation, the potential of 0 V and the potential VL are supplied to the signal line S_1 and the signal line S_2, respectively, whereby all the second transistors are off. The potential of the node FG of each memory cell in the first row is 0 V or V2; thus, all the second transistors can be turned off by setting the potential of the signal line S_1 to 0 V. On the other hand, when the potential VL is supplied to the word line WL_2, the potential of the nodes FG in the second row becomes lower than the potential right after data writing. Therefore, in order to prevent the second transistors from being turned on, the signal line S_2 is set at the potential (the potential VL) as that of the word line WL_2. That is, the potentials of the signal line S and the word line WL in the row where data is not read are set to the same potential (the potential VL). Thus, all the second transistors can be turned off.

In the case where the circuit illustrated in FIG. 3 is used as the reading circuit, a condition where reading can be performed is produced by turning off the switch element 1206 and turning on the switch element 1300. A constant potential (e.g., 0 V) is supplied to the source line SL, and the switch element 1202 of the bit line BL connected to the memory cell 1200 that is a target for reading is turned on, whereby the bit line BL is precharged. Alternatively, the switch element 1206 is turned off and the switch element 1302 is turned on, whereby the bit line BL can be precharged using the data line. In the case where the resistance between the bit line BL and the source line SL is low, a low potential is input to the amplifier circuit 1204 and the potential of the data signal OUTPUT is low. In the case where the resistance between the bit line BL and the source line SL is high, a high potential is input to the amplifier circuit 1204 and the potential of the data signal OUTPUT is high.

Next, an example of refresh operation will be described. Note that the semiconductor device according to one embodiment of the disclosed invention can hold data for a significantly long time; thus, the frequency of refresh operation is 1/1000 or less, preferably 1/10000 or less, of that of a typical DRAM or the like, for example. Specifically, in the semiconductor device according to one embodiment of the disclosed invention, it is possible that the refresh operation per memory cell be performed every $10^3$ or more seconds, preferably every $10^4$ or more seconds. Therefore, the semiconductor device according to one embodiment of the disclosed invention can sufficiently suppress power consumption resulting from refresh operation.

First, the switch element 1202 of the bit line BL connected to the memory cell 1200 that is a target for refreshing is turned on, and the bit line BL is precharged. Note that although the bit line BL is precharged here using a wiring which is separate from the reading circuit, the bit line BL may be precharged from the reading circuit 1102 side by using a wiring shared with the reading circuit 1102. For example, in the case where the circuit illustrated in FIG. 3 is used as the reading circuit, the bit line can be precharged using the data line.

Next, the switch element 1202 is turned off, and the bit line BL is set floating. In this state, a potential at which the second transistor of the memory cell 1200 that is the target for refreshing is turned on is supplied to the signal line connected to the memory cell 1200 that is the target for refreshing. Then, the potential of the bit line changes depending on the amount of charge held at the node FG. The amplifier circuit 1204 of the reading circuit 1102 amplifies this change and outputs a potential of 0 V or the potential V2.

Here, when the switch element 1206 for connecting the output terminal of the amplifier circuit 1204 and the bit line is turned on, the potential of 0 V or the potential V2 is supplied to the bit line. Because the second transistor of the memory cell 1200 that is the target for refreshing is on, the same data is written again to the memory cell 1200 that is the target for refreshing, in accordance with the charge held at the node FG.

<Operation 2 of Semiconductor Device>

Next, another example of operation of the semiconductor device will be described. Note that the operation of the semiconductor device, which includes a memory cell array with two rows and two columns, is described here for easy understanding. The data to be written is the same as that in the above write operation.

In the write operation described in <Operation 1 of Semiconductor Device>(i.e., writing to the first row), the potential of the word line WL_2 at the time of writing is set to a potential of 0 V; thus, for example, in the case where data which has been written to the memory cell 1200 (2,1) or the memory cell 1200 (2,2) is data "1", steady-state current might flow between the bit line BL_1 and the bit line BL_2. This is because at the time of the writing to the first row, the first transistors in the memory cells in the second row are turned on, whereby the bit line BL_1 and the bit line BL_2 are connected at low resistance through the source line. In the write operation described here, such steady-state current is less likely to be generated.

First, a potential V1 is supplied to the signal line S_1 in the first row, whereby the second transistors in the first row are turned on. Further, a potential of 0 V is supplied to the signal line S_2 in the second row, whereby the second transistors in the second row are turned off. Further, a potential V2 is supplied to the bit line BL_1 in the first column, and the potential of 0 V is supplied to the bit line BL_2 in the second column. As a result, the potential V2 and the potential of 0 V are supplied to the node FG of the memory cell 1200 (1,1) and the node FG of the memory cell 1200 (1,2), respectively. Here, the potential V2 is set so as to generate a potential difference which is larger than the threshold voltage of the first transistor. Then, the potential of the signal line S_1 in the first row is set to 0 V, whereby the second transistors in the first row are turned off; thus, writing is completed.

Note that the word line WL_1 in the first row and the word line WL_2 in the second row are at the potential of 0 V and the potential VL, respectively, during the write operation. When the word line WL_2 in the second row is at the potential VL, in the second row, the first transistors of the memory cells in which either data "0" or data "1" is held are turned off. Further, the potential V2 is supplied to the source line SL during the write operation. In the case where all the written data are data "0", a potential of 0 V may be supplied to the source line.

At the end of the write operation, before the potential of the bit line BL_1 in the first column is changed, the potential of the signal line S_1 in the first row is set to 0 V. After the write operation, the threshold value of a memory cell is Vw0 in the case where data "0" has been written and Vw1 in the case where data "1" has been written. Note that Vw0>0>Vw1 is satisfied here.

In the write operation, the first transistors in the memory cells in the row to which data is not written (in this case, the second row) are off. Thus, only the memory cells in the row to which data is written have a problem with steady-state current between the bit line and the source line. In the case where data "0" is written to the memory cell of the row to which data is written, the first transistor in the memory cell is off; thus, the problem of steady-state current does not arise. On the other hand, in the case where data "1" is written to the memory cell of the row to which data is written, the first transistor in the memory cell is on; thus, steady-state current is generated if there is a potential difference between the source line SL and the bit line BL (in this case, the bit line BL_1). The potential of the source line SL is thus set equal to the potential V2 of the bit line BL_1, whereby steady-state current between the bit line and the source line can be prevented.

As described above, generation of steady-state current at the time of writing can be prevented in the write operation. In other words, power consumed at the time of the write operation can be sufficiently reduced in the above write operation.

Note that the read operation and the refresh operation are performed in a manner similar to those of the above read operation and refresh operation.

With the use of a material capable of decreasing off-state current, such as an oxide semiconductor, stored data can be held for a significantly long time. Accordingly, the frequency of refresh operation can be drastically lowered, and therefore, power consumption can be sufficiently reduced. Moreover, stored data can be held for a long time even in a situation where power is not supplied.

The above-described semiconductor device does not require high voltage for writing data and does not have the problem of degradation of the element. Therefore, there is no limitation on the number of times data can be rewritten, which is a problem of a conventional nonvolatile memory, and the reliability thereof is drastically improved. Furthermore, since data is written by turning on or off the transistor, high-speed operation can be easily realized. Additionally, there is an advantage in that operation for erasing data is not needed.

With the use of a transistor containing a semiconductor material capable of realizing high-speed operation in combination with a transistor containing a semiconductor material capable of decreasing off-state current, a semiconductor device can perform operations (e.g., data read operation) at sufficiently high speed. Further, a transistor containing a semiconductor material capable of realizing high-speed operation can favorably realize a variety of circuits (e.g., a logic circuit or a driver circuit) which needs to be able to operate at high speed.

The structures, methods, and the like described in this embodiment can be combined as appropriate with any of the structures, methods, and the like described in the other embodiments.

Embodiment 3

In this embodiment, a structure and a manufacturing method of a semiconductor device according to one embodiment of the present invention will be described with reference to FIGS. 5A and 5B, FIGS. 6A to 6D, FIGS. 7A to 7D, FIGS. 8A to 8D, and FIGS. 9A to 9C.

<Cross-sectional Structure and Planar Structure of Semiconductor Device>

Figure 5A:
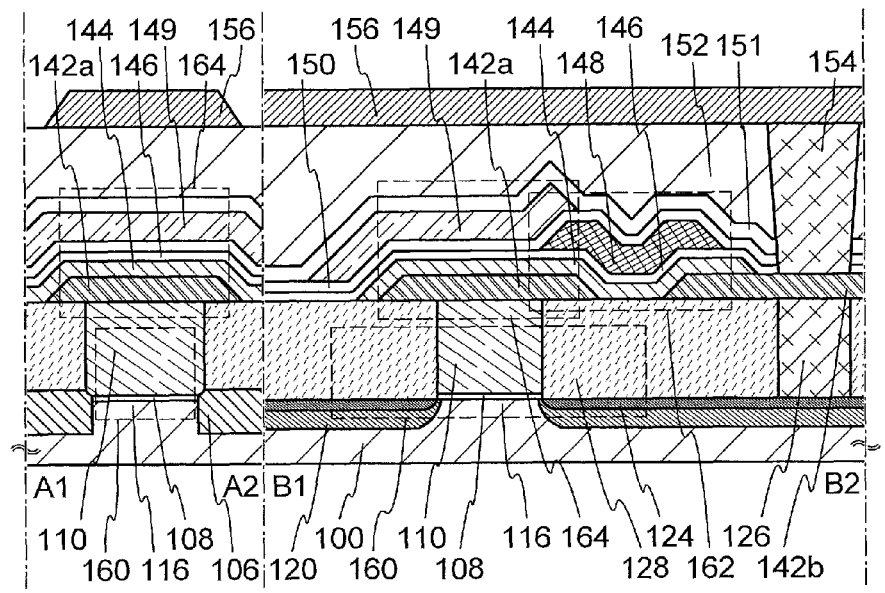
FIGS. 5A and 5B are a cross-sectional view and a plan view of a semiconductor device.
Figure 5B:
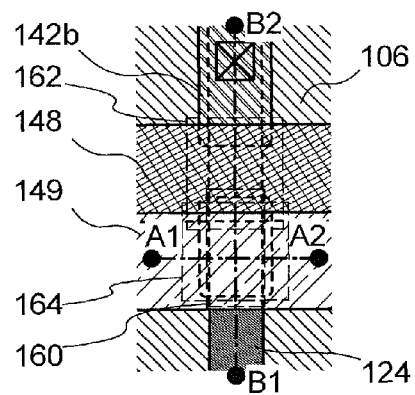

FIGS. 5A and 5B illustrate an example of a structure of a semiconductor device. FIG. 5A is a cross-sectional view of the semiconductor device, and FIG. 5B is a plan view of the semiconductor device. Here, FIG. 5A corresponds to a cross section along line A1-A2 and line B1-B2 in FIG. 5B. The semiconductor device illustrated in FIGS. 5A and 5B includes, in a lower portion, a transistor 160 containing a first semiconductor material, and in an upper portion, a transistor 162 containing a second semiconductor material. Here, the first semiconductor material and the second semiconductor material are preferably different materials. For example, the first semiconductor material can be a semiconductor material other than an oxide semiconductor, and the second semiconductor material can be an oxide semiconductor material. The semiconductor material other than an oxide semiconductor may be, for example, silicon, germanium, silicon germanium, silicon carbide, indium phosphide, gallium arsenide, or the like and is preferably a single crystal semiconductor. A transistor containing such a semiconductor material can operate at high speed. On the other hand, a transistor containing an oxide semiconductor can hold charge for a long time owing to its characteristics.

Although both of the above transistors are n-channel transistors in the following description, it is needless to say that p-channel transistors can be used. Since the technical nature of the disclosed invention is to use a semiconductor material with which off-state current can be sufficiently decreased, such as an oxide semiconductor, in the transistor 162 so that data can be stored, it is not necessary to limit a specific structure of the semiconductor device, such as a material of the semiconductor device or a structure of the semiconductor device, to the structure described here.

The transistor 160 in FIGS. 5A and 5B includes a channel formation region 116 provided in a substrate 100 containing the first semiconductor material (such as silicon), impurity regions 120 provided such that the channel formation region 116 is sandwiched therebetween, metal compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode. That is, in this specification, the term "source electrode" may include a source region.

An electrode 126 is connected to part of the metal compound region 124 of the transistor 160. Here, the electrode 126 functions as a source electrode or a drain electrode of the transistor 160. Further, an element isolation insulating layer 106 is formed over the substrate 100 so as to surround the transistor 160, and an insulating layer 128 is formed to cover the transistor 160. Note that in order to realize higher integration, the transistor 160 preferably has a structure without a sidewall insulating layer as illustrated in FIGS. 5A and 5B. On the other hand, in the case where characteristics of the transistor 160 have priority, a sidewall insulating layer may be provided on a side surface of the gate electrode 110, and the impurity regions 120 may include a region having a different impurity concentration in a region overlapping with the sidewall insulating layer.

The transistor 162 illustrated in FIGS. 5A and 5B includes a source or drain electrode 142$a$ and a source or drain electrode 142$b$ over the insulating layer 128, an oxide semiconductor layer 144 electrically connected to the source or drain electrode 142$a$ and the source or drain electrode 142$b$, a gate insulating layer 146 covering the source or drain electrode 142$a$, the source or drain electrode 142$b$, and the oxide semiconductor layer 144, and a gate electrode 148 provided over the gate insulating layer 146 so as to overlap with the oxide semiconductor layer 144.

Here, the oxide semiconductor layer 144 is preferably an oxide semiconductor layer which is purified by sufficiently removing an impurity such as hydrogen therefrom or by sufficiently supplying oxygen thereto. The carrier concentration of the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen, is less than $1 \times 10^{12}/cm^3$, preferably less than $1 \times 10^{11}/cm^3$, more preferably less than $1.45 \times 10^{10}/cm^3$. For example, the off-state current (per unit channel width (1 μm), here) at room temperature (25° C.) is 10 zA (1 zA (zeptoampere) is $1 \times 10^{-21}$ A) or less, preferably 1 zA or less. In this manner, by using an i-type (intrinsic) or substantially i-type oxide semiconductor, the transistor 162 which has extremely favorable off-state current characteristics can be obtained.

A capacitor 164 in FIGS. 5A and 5B includes the source or drain electrode 142$a$, the oxide semiconductor layer 144, the gate insulating layer 146, an insulating layer 150, and an electrode 149. In other words, the source or drain electrode 142$a$ functions as one electrode of the capacitor 164, and the electrode 149 functions as the other electrode of the capacitor 164.

In the capacitor 164 of FIGS. 5A and 5B, the oxide semiconductor layer 144, the gate insulating layer 146, and the insulating layer 150 are stacked, whereby insulation between the source or drain electrode 142$a$ and the electrode 149 can be sufficiently secured. Note that the capacitor 164 without including one of the gate insulating layer 146 and the insulating layer 150 may be employed in order to secure sufficient capacitance. Further, the capacitor 164 without including the oxide semiconductor layer 144 may be employed.

In the structure described in this embodiment, the transistor 160 and the transistor 162 are provided so as to at least partly overlap each other. In addition, the transistor 162 and the capacitor 164 are provided so as to overlap with the transistor 160. For example, the electrode 149 of the capacitor 164 is provided to overlap with at least part of the gate electrode 148 of the transistor 162. Further, the electrode 149 of the capacitor 164 may be provided to overlap with at least part of the gate electrode 110 of the transistor 160. By employing such a planar layout, high integration can be realized. For example, given that the minimum feature size is F, the area occupied by a memory cell can be approximately $9 F^2$ to $25 F^2$.

The insulating layer 150 is provided so as to cover the gate electrode 148, an insulating layer 151 is provided over the transistor 162 and the capacitor 164, and an insulating layer 152 is provided over the insulating layer 151. An electrode 154 is provided in an opening formed in the gate insulating layer 146, the insulating layer 150, the insulating layer 151, the insulating layer 152, and the like, and a wiring 156 is formed over the insulating layer 152 and connected to the electrode 154. The wiring 156 electrically connects one memory cell to another memory cell. Although the metal compound region 124, the source or drain electrode 142$b$, and the wiring 156 are connected by the electrode 126 and the electrode 154 in FIGS. 5A and 5B, the disclosed invention is not limited to this structure. For example, the source or drain electrode 142$b$ may be directly in contact with the metal compound region 124. Alternatively, the wiring 156 may be directly in contact with the source or drain electrode 142$b$.

Note that in FIGS. 5A and 5B, the electrode 126 connecting the metal compound region 124 and the source or drain electrode 142$b$ and the electrode 154 connecting the source or drain electrode 142$b$ and the wiring 156 are disposed to overlap each other. In other words, a region in which the electrode 126 serving as a source electrode or a drain electrode of the transistor 160 is in contact with the source or drain electrode 142$b$ of the transistor 162 overlaps with a region in which the source or drain electrode 142$b$ of the transistor 162 is in contact with the electrode 154. By employing such a layout, higher integration can be realized. It is needless to say that this structure is an example and therefore the disclosed invention is not limited to this structure.

<Method for Manufacturing Semiconductor Device>

Next, an example of a method for manufacturing the semiconductor device will be described. First, a method for manufacturing the transistor 160 in the lower portion will be described below with reference to FIGS. 6A to 6D and FIGS. 7A to 7D; then, a method for manufacturing the transistor 162 in the upper portion and the capacitor 164 will be described with reference to FIGS. 8A to 8D and FIGS. 9A to 9C.

<Method for Manufacturing Transistor in Lower Portion>

Figure 6A:
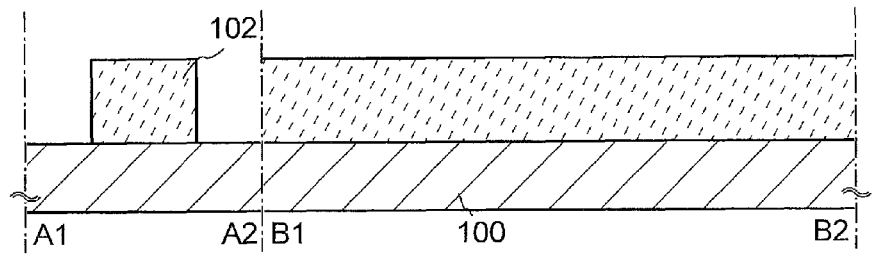
FIGS. 6A to 6D are cross-sectional views illustrating a manufacturing process of a semiconductor device.
Figure 6B:
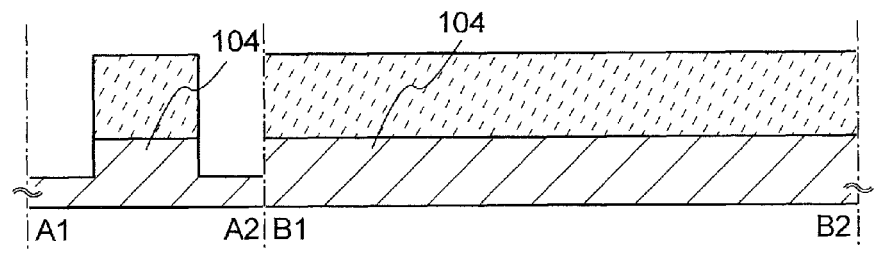

First, the substrate 100 containing the first semiconductor material is prepared (see FIG. 6A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 containing the first semiconductor material. Here, an example of the case where a single crystal silicon substrate is used as the substrate 100 containing the first semiconductor material is described. Note that the term "SOI substrate" generally means a substrate where a silicon semiconductor layer is provided over an insulating surface. In this specification and the like, the term "SOI substrate" also means a substrate where a semiconductor layer containing a material other than silicon is provided over an insulating surface. That is, a semiconductor layer included in the "SOI substrate" is not limited to a silicon semiconductor layer. Moreover, the SOI substrate can be a substrate having a structure where a semiconductor layer is provided over an insulating substrate such as a glass substrate with an insulating layer interposed therebetween.

Note that it is preferable that a single crystal semiconductor substrate of silicon or the like be particularly used as the substrate 100 containing the first semiconductor material because the speed of read operation of the semiconductor device can be increased.

A protective layer 102 serving as a mask for forming an element isolation insulating layer is formed over the substrate 100 (see FIG. 6A). As the protective layer 102, an insulating layer formed using a material such as silicon oxide, silicon nitride, silicon oxynitride, or the like can be used, for example. Note that before or after this step, an impurity element imparting n-type conductivity or an impurity element imparting p-type conductivity may be added to the substrate 100 in order to control the threshold voltage of the transistor. When the semiconductor material contained in the substrate 100 is silicon, phosphorus, arsenic, or the like can be used as the impurity element imparting n-type conductivity. Boron, aluminum, gallium, or the like can be used as the impurity element imparting p-type conductivity.

Next, part of the substrate 100 in a region not covered with the protective layer 102 (i.e., in an exposed region) is removed by etching using the protective layer 102 as a mask. Thus, a semiconductor region 104 isolated from the other semiconductor regions is formed (see FIG. 6B). As the etching, dry etching is preferably performed, but wet etching may be performed. An etching gas or an etchant can be selected as appropriate depending on a material to be etched.

Figure 6C:
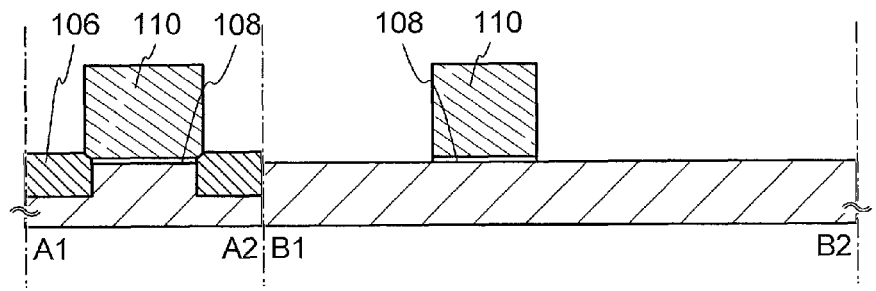

Then, an insulating layer is formed so as to cover the semiconductor region 104, and the insulating layer in a region overlapping with the semiconductor region 104 is selectively removed; thus, the element isolation insulating layer 106 is formed (see FIG. 6C). The insulating layer is formed using silicon oxide, silicon nitride, silicon oxynitride, or the like. As a method for removing the insulating layer, any of etching treatment, polishing treatment such as chemical mechanical polishing (CMP), and the like can be employed. Note that the protective layer 102 is removed after the formation of the semiconductor region 104 or after the formation of the element isolation insulating layer 106.

The CMP treatment is a method for planarizing a surface of an object to be processed by a combination of chemical and mechanical actions. More specifically, the CMP treatment is a method in which a polishing cloth is attached to a polishing stage, the polishing stage and an object to be processed are each rotated or swung while a slurry (an abrasive) is supplied between the object to be processed and the polishing cloth, and the surface of the object to be processed is polished by a chemical reaction between the slurry and the surface of the object to be processed and by a mechanical polishing action of the polishing cloth on the object to be processed.

Note that as a method for forming the element isolation insulating layer 106, a method in which an insulating region is formed by introduction of oxygen, or the like can be used instead of the method in which the insulating layer is selectively etched.

Next, an insulating layer is formed over a surface of the semiconductor region 104, and a layer including a conductive material is formed over the insulating layer.

The insulating layer is processed into a gate insulating layer later and can be formed by, for example, heat treatment (thermal oxidation treatment, thermal nitridation treatment, or the like) of the surface of the semiconductor region 104. Instead of heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. It is needless to say that the insulating layer may be formed by a CVD method, a sputtering method, or the like. The insulating layer preferably has a single-layer structure or a stacked-layer structure with a film including silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The insulating layer can have a thickness of 1 nm to 100 nm, preferably, 10 nm to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched; thus, the gate insulating layer 108 and the gate electrode 110 are formed (see FIG. 6C).

Figure 6D:
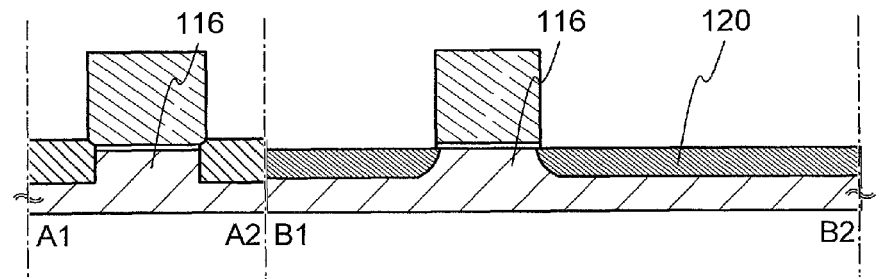

Next, phosphorus (P), arsenic (As), or the like is added to the semiconductor region 104, whereby the channel formation region 116 and the impurity regions 120 are formed (see FIG. 6D). Note that phosphorus or arsenic is added here in order to form an n-type transistor; an impurity element such as boron (B) or aluminum (Al) may be added in the case of forming a p-type transistor. Here, the concentration of the impurity added can be set as appropriate; the concentration is preferably set high when a semiconductor element is highly miniaturized.

Note that a sidewall insulating layer may be formed around the gate electrode 110, and impurity regions to which the impurity element is added at a different concentration may be formed.

Figure 7A:
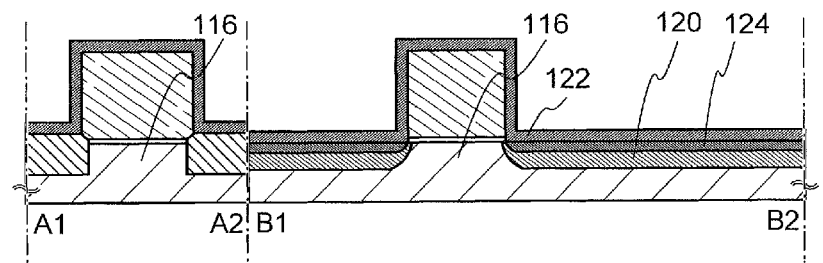
FIGS. 7A to 7D are cross-sectional views illustrating a manufacturing process of a semiconductor device.

Next, a metal layer 122 is formed so as to cover the gate electrode 110, the impurity regions 120, and the like (see FIG. 7A). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material contained in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound regions 124 that are in contact with the impurity regions 120 are formed (see FIG. 7A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the metal compound regions 124 are formed.

Figure 7B:
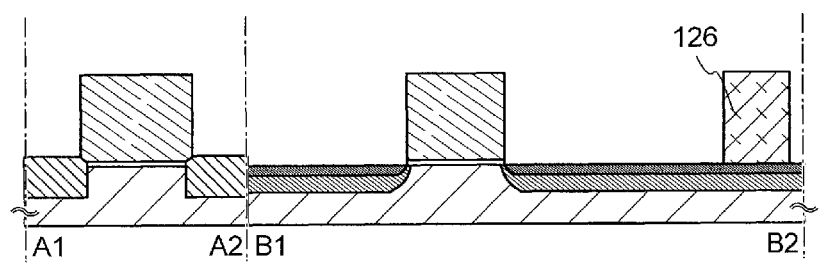

Next, the electrode 126 is formed in a region in contact with part of the metal compound region 124 (see FIG. 7B). The electrode 126 is formed by, for example, forming a layer including a conductive material and then selectively etching the layer. The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed.

Alternatively, the electrode 126 can be formed by forming an opening reaching the metal compound region 124 in the insulating layer 128 after the formation of the insulating layer 128 and then by filling the opening.

In such a case, for example, it is possible to employ a method in which a thin titanium film is formed by a PVD method and a thin titanium nitride film is formed by a CVD method in a region including the opening, and then a tungsten film is formed so as to fill the opening. Here, the titanium film formed by a PVD method functions to reduce an oxide film (e.g., a natural oxide film) formed on a surface where the titanium film is formed, and to decrease the contact resistance with a lower electrode or the like (here, the metal compound region 124). The titanium nitride film formed after the formation of the titanium film has a barrier function for suppressing diffusion of the conductive material. A copper film may be formed by a plating method after the formation of a barrier film of titanium, titanium nitride, or the like.

Figure 7C:
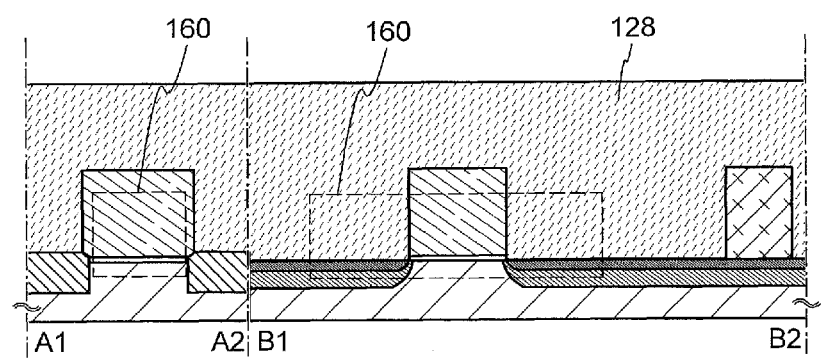

Next, the insulating layer 128 is formed so as to cover the components formed in the above steps (see FIG. 7C). The insulating layer 128 can be formed using an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that a porous insulating layer with such a material may be employed as the insulating layer 128. The porous insulating layer has a lower dielectric constant than an insulating layer with high density and thus makes it possible to further reduce capacitance due to electrodes or wirings. Alternatively, the insulating layer 128 can be formed using an organic insulating material such as polyimide or acrylic. Note that although a single-layer structure of the insulating layer 128 is used in this embodiment, an embodiment of the disclosed invention is not limited to this example. A stacked-layer structure with two or more layers may be employed.

Through the above steps, the transistor 160 is formed with the use of the substrate 100 containing the first semiconductor material (see FIG. 7C). A feature of the transistor 160 is that it can operate at high speed. With the use of that transistor as a reading transistor, data can be read at high speed.

Figure 7D:
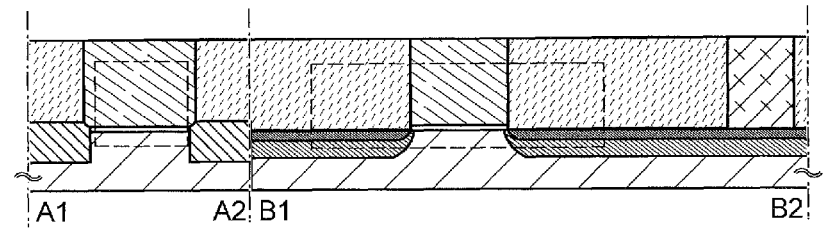

After that, as treatment performed before the transistor 162 and the capacitor 164 are formed, CMP treatment of the insulating layer 128 is performed so that upper surfaces of the gate electrode 110 and the electrode 126 are exposed (see FIG. 7D). As treatment for exposing the upper surfaces of the gate electrode 110 and the electrode 126, etching treatment or the like can also be employed instead of CMP treatment; in order to improve characteristics of the transistor 162, a surface of the insulating layer 128 is preferably made as flat as possible.

Note that before or after each of the above steps, a step of forming an electrode, a wiring, a semiconductor layer, an insulating layer, or the like may be further performed. For example, when the wiring has a multi-layer structure of a stacked-layer structure including insulating layers and conductive layers, a highly integrated semiconductor device can be realized.

<Method for Manufacturing Transistor in Upper Portion>

Figure 8A:
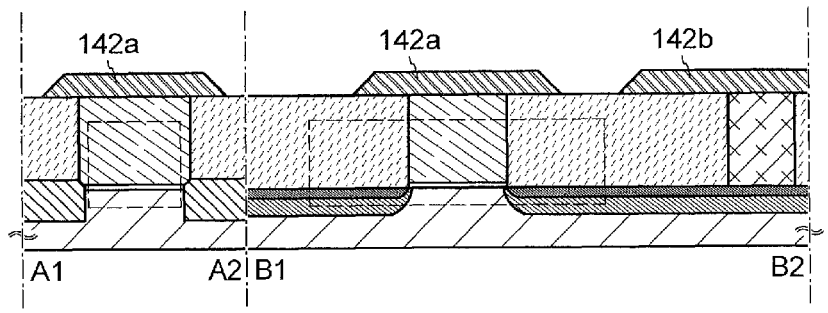
FIGS. 8A to 8D are cross-sectional views illustrating a manufacturing process of a semiconductor device.

Next, a conductive layer is formed over the gate electrode 110, the electrode 126, the insulating layer 128, and the like, and the source or drain electrode 142a and the source or drain electrode 142b are formed by selectively etching the conductive layer (see FIG. 8A).

The conductive layer can be formed by a PVD method such as a sputtering method, or a CVD method such as a plasma CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a stacked-layer structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, or the like. Note that the conductive layer having a single-layer structure of a titanium film or a titanium nitride film has an advantage in that it can be easily processed into the source or drain electrode 142a and the source or drain electrode 142b having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

The conductive layer is preferably etched such that the source or drain electrode 142a and the source or drain electrode 142b are formed to have tapered end portions. Here, the taper angle is preferably 30° to 60°, for example. When the source or drain electrode 142a and the source or drain electrode 142b are formed by etching so as to have tapered end portions, coverage of the source or drain electrode 142a and the source or drain electrode 142b with the gate insulating layer 146 which is formed later can be improved and disconnection of the gate insulating layer 146 can be prevented.

The channel length (L) of the transistor in the upper portion is determined by a distance between lower edge portions of the source or drain electrode 142a and the source or drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. For these reasons, the channel length (L) of the transistor to be formed later can be set in the range of 10 nm to 1000 nm (1 μm), and the circuit can operate at higher speed. In addition, power consumption of the semiconductor device can be reduced by miniaturization.

Note that an insulating layer functioning as a base may be provided over the insulating layer 128. The insulating layer can be formed by a PVD method, a CVD method, or the like.

Further, an insulating layer may be formed over each of the source or drain electrode 142a and the source or drain electrode 142b. The insulating layer is formed so as to overlap with part of a gate electrode which is formed later. With such insulating layers, capacitance between the gate electrode and the source or drain electrodes can be reduced.

Figure 8B:
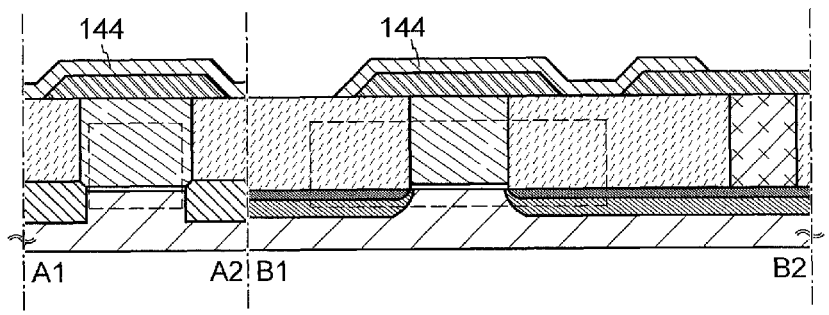
Figure 8C:
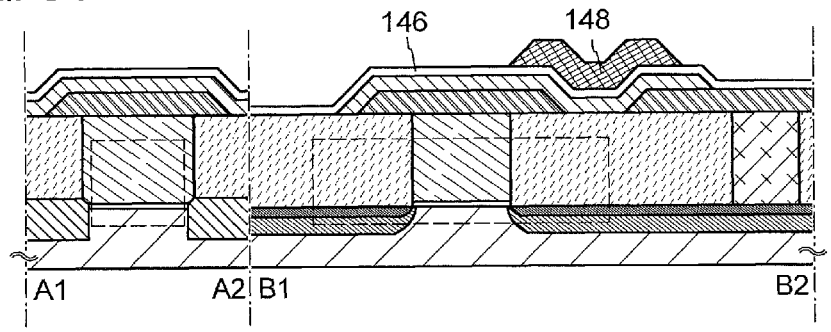

Next, the oxide semiconductor layer 144 is formed by forming an oxide semiconductor layer so as to cover the source or drain electrode 142a and the source or drain electrode 142b and then by selectively etching the oxide semiconductor layer (see FIG. 8B).

The oxide semiconductor layer can be formed using a four-component metal oxide such as an In—Sn—Ga—Zn—O—based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor, a two-component metal oxide such as an In—Zn—O-based oxide semiconductor, an In—Ga—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor, a single-component metal oxide such as an In—O-based oxide semiconductor, a Sn—O-based oxide semiconductor, or a Zn—O-based oxide semiconductor, or the like.

In particular, an In—Ga—Zn—O-based oxide semiconductor material has sufficiently high resistance when there is no electric field and thus off-state current can be sufficiently reduced. In addition, also having high field-effect mobility, the In—Ga—Zn—O-based oxide semiconductor material is suitable for a semiconductor material used in a semiconductor device.

As a typical example of the In—Ga—Zn—O-based oxide semiconductor material, an oxide semiconductor material represented by $InGaO_3(ZnO)_m$ (m>0) is given. Using M instead of Ga, there is an oxide semiconductor material represented by $InMO_3(ZnO)_m$ (m>0). Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

As a target used for forming the oxide semiconductor layer by a sputtering method, a target having a composition ratio of In:Ga:Zn=1:x:y (x is greater than or equal to 0 and y is greater than or equal to 0.5 and less than or equal to 5) is preferably used. For example, a target for oxide semiconductor deposition which has a composition ratio of $In_2O_3:Ga_2O_3:ZnO$=1:1:2 [molar ratio] (x=1, y=1) or the like can be used. Alternatively, a target for oxide semiconductor deposition which has a composition ratio of $In_2O_3:Ga_2O_3:ZnO$=1:1:1 [molar ratio] (x=1, y=0.5), a target for oxide semiconductor deposition which has a composition ratio of $In_2O_3:Ga_2O_3:ZnO$=1:1:4 [molar ratio] (x=1, y=2), or a target for oxide semiconductor deposition which has a composition ratio of $In_2O_3:Ga_2O_3:ZnO$=1:0:2 [molar ratio] (x=0, y=1) can be used.

In this embodiment, an oxide semiconductor layer having an amorphous structure is formed by a sputtering method with the use of a target for In—Ga—Zn—O-based oxide semiconductor deposition.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The relative density of the metal oxide in the target for oxide semiconductor deposition is 80% or more, preferably 95% or more, and more preferably 99.9% or more. The use of the target for oxide semiconductor deposition which has high relative density makes it possible to form an oxide semiconductor layer having a dense structure.

The atmosphere in which the oxide semiconductor layer is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppm or less).

In forming the oxide semiconductor layer, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer may be room temperature (25° C.±10°

C.). Then, moisture in the treatment chamber is removed, a sputtering gas from which hydrogen, water, or the like is reduced is introduced, and the above-described target is used; thus, the oxide semiconductor layer is formed. By forming the oxide semiconductor layer while heating the object to be processed, an impurity in the oxide semiconductor layer can be reduced. Moreover, damage due to sputtering can be reduced. In order to remove the moisture in the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be reduced.

For example, conditions for forming the oxide semiconductor layer can be set as follows: the distance between the object to be processed and the target is 170 mm, the pressure is 0.4 Pa, the direct current (DC) power is 0.5 kW, and the atmosphere is an oxygen (100% oxygen) atmosphere, an argon (100% argon) atmosphere, or a mixed atmosphere of oxygen and argon. Note that a pulsed direct current (DC) power source is preferably used because dust (such as a powder substance formed at the time of the film formation) can be reduced and the film thickness can be made uniform. The thickness of the oxide semiconductor layer is set in the range of 1 nm to 50 nm, preferably 1 nm to 30 nm, more preferably 1 nm to 10 nm. The use of the oxide semiconductor layer of such a thickness makes it possible to suppress a short channel effect which is caused by miniaturization. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like.

Note that before the oxide semiconductor layer is formed by a sputtering method, reverse sputtering in which plasma is generated with an argon gas introduced is preferably performed so that a material attached to a formation surface (e.g., a surface of the insulating layer 128) is removed. Here, the reverse sputtering is a method in which ions collide with a surface to be processed so that the surface is modified, whereas normal sputtering is a method in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After that, heat treatment (first heat treatment) is preferably performed on the oxide semiconductor layer. Through the first heat treatment, excess hydrogen (including water or a hydroxyl group) in the oxide semiconductor layer can be removed, the structure of the oxide semiconductor layer can be ordered, and defect states in an energy gap can be reduced. For example, the temperature of the first heat treatment can be set higher than or equal to 300° C. and lower than 550° C., or higher than or equal to 400° C. and lower than or equal to 500° C.

For example, after an object to be processed is introduced into an electric furnace including a resistance heater or the like, the heat treatment can be performed at 450° C. for one hour in a nitrogen atmosphere. The oxide semiconductor layer is not exposed to the air during the heat treatment so that entry of water or hydrogen can be prevented.

An apparatus used for the heat treatment is not limited to the electric furnace and may be an apparatus for heating an object to be processed by thermal radiation or thermal conduction from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed because the heat treatment can be performed in a short time. Note that the inert gas may be switched to a gas including oxygen during the treatment. This is because defect states in an energy gap caused by oxygen vacancies can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into the heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the oxide semiconductor layer is formed, after the gate insulating layer is formed, or after a gate electrode is formed. Such dehydration treatment or dehydrogenation treatment may be performed once or plural times.

The etching of the oxide semiconductor layer may be performed either before the heat treatment or after the heat treatment. Dry etching is preferably used in terms of element miniaturization, but wet etching may be used. An etching gas or an etchant can be selected as appropriate depending on a material to be etched. Note that in the case where leakage in an element or the like does not cause a problem, the oxide semiconductor layer does not necessarily need to be processed in an island shape.

Next, the gate insulating layer 146 is formed in contact with the oxide semiconductor layer 144. Then, over the gate insulating layer 146, the gate electrode 148 is formed in a region overlapping with the oxide semiconductor layer 144 (see FIG. 8C).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like. The gate insulating layer 146 may have a single-layer structure or a stacked-layer structure. There is no particular limitation on the thickness of the gate insulating layer 146; the thickness is preferably small in order to ensure the operation of the transistor when the semiconductor device is miniaturized. For example, in the case of using silicon oxide, the thickness can be 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. The use of a high-k material for the gate insulating layer 146 makes it possible to increase the thickness in order to suppress gate leakage as well as ensuring electrical properties. Note that a stacked-layer structure of a film containing a high-k material and a film containing any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By the second heat treatment, variation in electrical characteristics of the transistor can be reduced. In the case where the gate insulating layer 146 contains oxygen, oxygen can be supplied to the oxide semiconductor layer 144 and oxygen vacancies in the oxide semiconductor layer 144 can be filled; thus, the oxide semiconductor layer which is i-type (intrinsic) or substantially i-type can also be formed.

Note that the second heat treatment is performed in this embodiment after the gate insulating layer 146 is formed; there is no limitation on the timing of the second heat treatment. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as to contain impurities other than components as little as possible.

The gate electrode 148 can be formed by forming a conductive layer over the gate insulating layer 146 and then by selectively etching the conductive layer. The conductive layer to be the gate electrode 148 can be formed by a PVD method such as a sputtering method, or a CVD method such as a plasma CVD method. The details are similar to those of the source or drain electrode 142a or the like; thus, the description thereof can be referred to. Through the above steps, the transistor 162 can be formed.

Figure 8D:
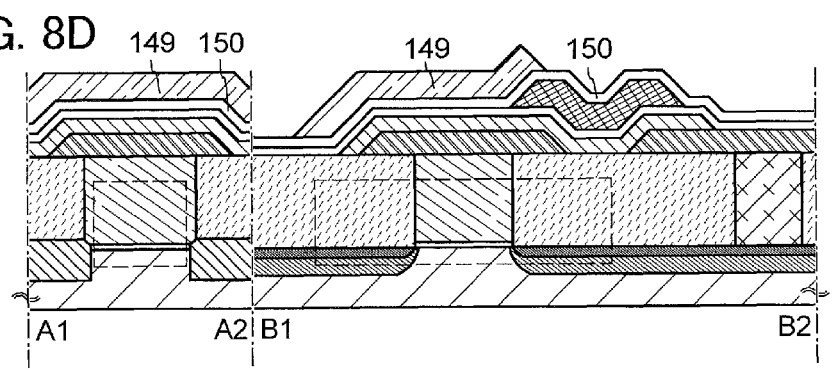

Then, the insulating layer 150 is formed to cover the gate insulating layer 146 and the gate electrode 148, and then the electrode 149 is formed over the insulating layer 150 in a region overlapping with the source or drain electrode 142a (see FIG. 8D). Before the formation of the insulating layer 150, the gate insulating layer 146 in a region where the capacitor 164 is to be formed may be removed. By removing the gate insulating layer 146 in the region where the capacitor 164 is to be formed, the capacitance of the capacitor 164 can be increased.

The insulating layer 150 can be formed by a CVD method, a sputtering method, or the like. The details are similar to those of the gate insulating layer 146 or the like; thus, the description thereof can be referred to.

The electrode 149 can be formed by forming a conductive layer over the insulating layer 150 and then by selectively etching the conductive layer. The conductive layer to be the electrode 149 can be formed by a PVD method such as a sputtering method, or a CVD method such as a plasma CVD method. The details are similar to those of the source or drain electrode 142a or the like; thus, the description thereof can be referred to. Through the above process, the capacitor 164 can be formed.

The electrode 149, which is a capacitor electrode, is preferably formed to overlap with at least part of the gate electrode 148 of the transistor 162. In addition, the electrode 149 may be formed to overlap with at least part of the gate electrode 110 of the transistor 160. This is because, by employing such a structure, the area of the circuit can be sufficiently reduced. Note that this structure can be realized because the gate electrode 148 and the electrode 149 are formed using different layers. If these electrodes are formed using the same layer, it is difficult to obtain a structure in which the distance between the electrodes is sufficiently small, because of electrode pattern formation. In contrast, when the gate electrode 148 and the electrode 149 are formed using different layers, it is possible to obtain a structure in which not only is the distance between the electrodes sufficiently small, but also the electrodes partly overlap each other.

Figure 9A:
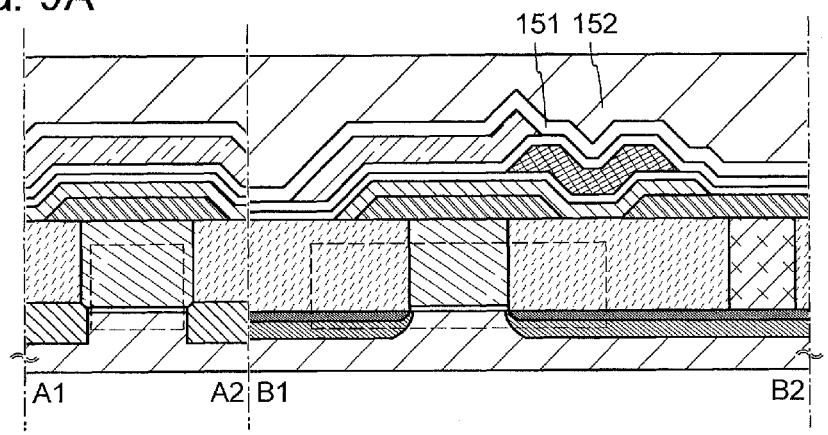
FIGS. 9A to 9C are cross-sectional views illustrating a manufacturing process of a semiconductor device.

Next, the insulating layer 151 and the insulating layer 152 are formed over the insulating layer 150 and the electrode 149 (see FIG. 9A). The insulating layer 151 and the insulating layer 152 can be formed by a PVD method, a CVD method, or the like. The insulating layer 151 and the insulating layer 152 can be formed using a material containing an inorganic insulating material such as silicon oxide, silicon oxynitride, silicon nitride, hafnium oxide, or aluminum oxide.

Note that the insulating layer 151 and the insulating layer 152 are preferably formed using a low dielectric constant material or a low dielectric constant structure (such as a porous structure). This is because when the insulating layer 151 and the insulating layer 152 have a low dielectric constant, capacitance generated between wirings, electrodes, or the like can be reduced and operation at higher speed can be achieved.

Note that although a stacked-layer structure of the insulating layer 151 and the insulating layer 152 is used in this embodiment, an embodiment of the disclosed invention is not limited to this example. A single-layer structure or a stacked-layer structure including three or more layers can also be used. Alternatively, a structure in which the insulating layers are not provided is also possible.

Note that the insulating layer 152 is desirably formed so as to have a flat surface. This is because when the insulating layer 152 has a flat surface, an electrode, a wiring, or the like can be favorably formed over the insulating layer 152 even in the case where the semiconductor device is miniaturized. Note that the insulating layer 152 can be planarized using a method such as CMP.

Figure 9B:
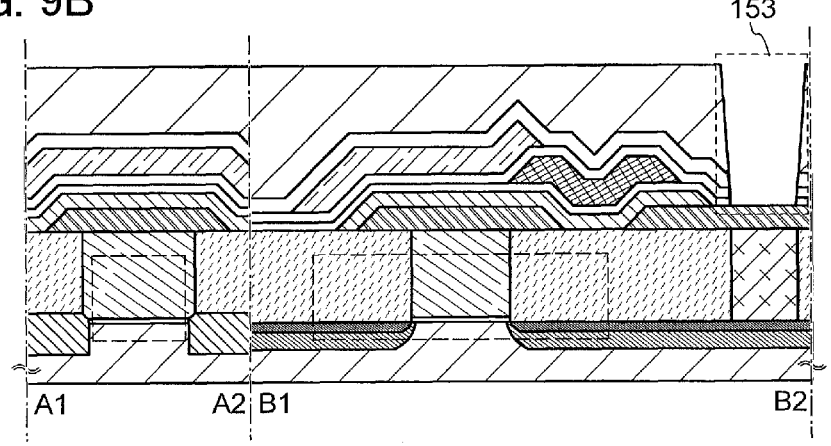

Next, an opening 153 reaching the source or drain electrode 142b is formed in the gate insulating layer 146, the insulating layer 150, the insulating layer 151, and the insulating layer 152 (see FIG. 9B). The opening 153 is formed by selective etching with a mask or the like.

Here, the opening 153 is preferably formed in a region overlapping with the electrode 126. By forming the opening 153 in such a region, the element area can be prevented from increasing due to a contact region of the electrodes. In other words, the degree of integration of the semiconductor device can be increased.

Figure 9C:
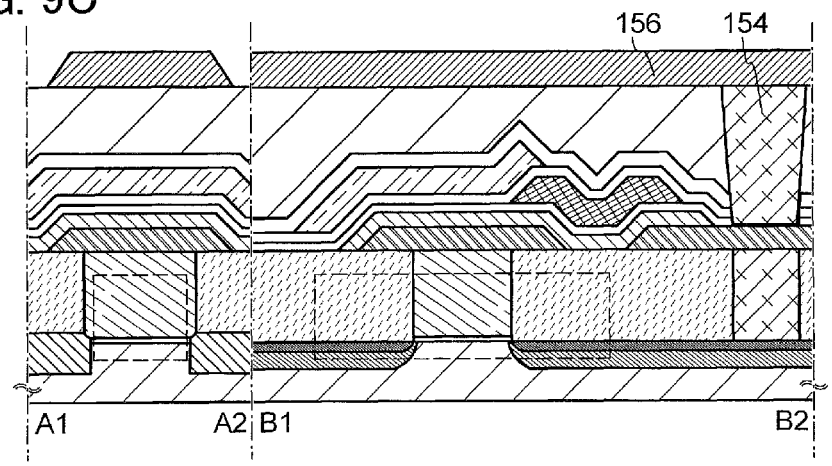

After that, the electrode 154 is formed in the opening 153, and the wiring 156 in contact with the insulating layer 152 and the electrode 154 is formed (see FIG. 9C).

The electrode 154 can be formed in such a manner, for example, that a conductive layer is formed in a region including the opening 153 by a PVD method, a CVD method, or the like and then part of the conductive layer is removed by etching, CMP, or the like.

Specifically, it is possible to employ a method, for example, in which a thin titanium film is formed in a region including the opening 153 by a PVD method and a thin titanium nitride film is formed by a CVD method, and then, a tungsten film is formed so as to be embedded in the opening 153. Here, the titanium film formed by a PVD method functions to reduce an oxide film (e.g., a natural oxide film) formed on a surface where the titanium film is formed, and to decrease the contact resistance with a lower electrode or the like (here, the source or drain electrode 142b). The titanium nitride film formed after the formation of the titanium film has a barrier function for suppressing diffusion of the conductive material. A copper film may be formed by a plating method after the formation of a barrier film of titanium, titanium nitride, or the like.

Note that in the case where the electrode 154 is formed by removing part of the conductive layer, the process is preferably performed so that the surface is planarized. For example, when a thin titanium film or a thin titanium nitride film is formed in a region including the opening 153 and then a tungsten film is formed so as to be embedded in the opening 153, excess tungsten, titanium, titanium nitride, or the like is removed and the planarity of the surface can be improved by subsequent CMP treatment. The surface including the electrode 154 is planarized in this manner, so that an electrode, a wiring, an insulating layer, a semiconductor layer, or the like can be favorably formed in a later step.

The wiring 156 is formed by forming a conductive layer by a PVD method such as a sputtering method, or a CVD method such as a plasma CVD method, and then by patterning the conductive layer. As a material of the conductive layer, an element selected from aluminum, chromium, copper, tantalum, titanium, molybdenum, and tungsten, an alloy including any of these elements as a component, or the like can be used. A material containing one of manganese, magnesium, zirconium, beryllium, neodymium, and scandium or a combination of a plurality of these elements may be used. The details are similar to those of the source or drain electrode 142a, the source or drain electrode 142b, and the like.

Through the above steps, the transistor 162 including the oxide semiconductor layer 144 which is purified and the capacitor 164 are completed (see FIG. 9C).

In the transistor 162 described in this embodiment, the oxide semiconductor layer 144 is purified. In addition, the carrier density of the oxide semiconductor layer 144 is, for example, less than $1 \times 10^{12}/cm^3$, preferably less than $1.45 \times 10^{10}/cm^3$, which is sufficiently lower than the carrier density of a general silicon wafer (approximately $1 \times 10^{14}/cm^3$). As a result of this, a sufficiently low off-state current can be obtained. For example, the off-state current (per unit channel width (1 μm), here) of the transistor 162 at room temperature (25° C.) is 10 zA (1 zA (zeptoampere) is $1 \times 10^{-21}$ A) or less, preferably 1 zA or less.

In this manner, by using the oxide semiconductor layer 144 which is purified and is intrinsic, it becomes possible to sufficiently reduce the off-state current of the transistor. With the use of such a transistor, a semiconductor device in which stored data can be held for an extremely long time can be provided.

The structures, methods, and the like described in this embodiment can be combined as appropriate with any of the structures, methods, and the like described in the other embodiments.

Embodiment 4

In this embodiment, the cases where the semiconductor device described in any of the above embodiments is applied to electronic devices will be described with reference to FIGS. 10A to 10F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 10A:
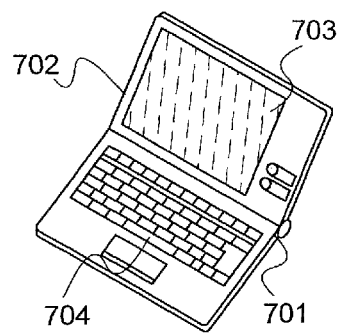
FIGS. 10A to 10F each illustrate an electronic device.

FIG. 10A illustrates a notebook personal computer, which includes a housing 701, a housing 702, a display portion 703, a keyboard 704, and the like. The semiconductor device described in any of the above embodiments is provided in at least one of the housings 701 and 702. Thus, a notebook personal computer with sufficiently low power consumption, in which writing and reading of data can be performed at high speed and data can be stored for a long time, can be realized.

Figure 10D:
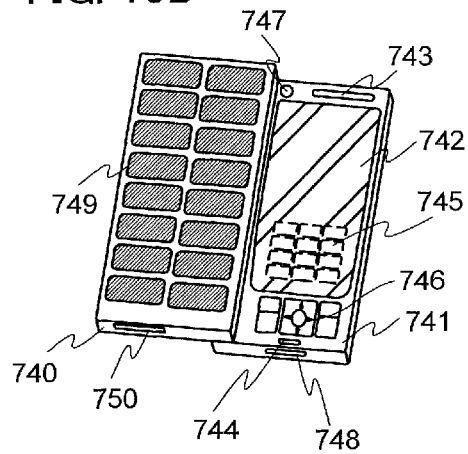
Figure 10B:
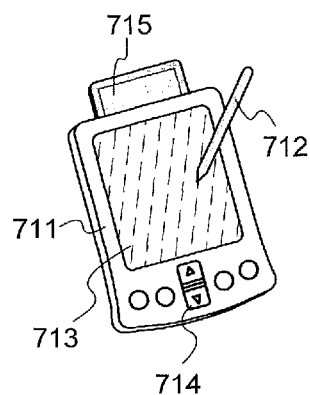

FIG. 10B illustrates a portable information terminal (PDA). A main body 711 is provided with a display portion 713, an external interface 715, operation buttons 714, and the like. Further, a stylus 712 for operation of the portable information terminal, or the like is provided. The semiconductor device described in any of the above embodiments is provided in the main body 711. Thus, a portable information terminal with sufficiently low power consumption, in which writing and reading of data can be performed at high speed and data can be stored for a long time, can be realized.

Figure 10E:
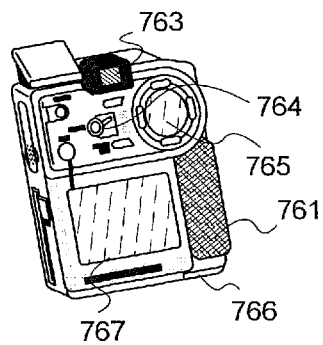
Figure 10C:
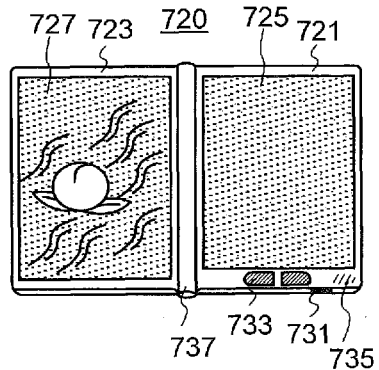

FIG. 10C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. At least one of the housings 721 and 723 is provided with the semiconductor device described in any of the above embodiments. Thus, an electronic book with sufficiently low power consumption, in which writing and reading of data can be performed at high speed and data can be stored for a long time, can be realized.

FIG. 10D illustrates a mobile phone set, which includes two housings, a housing 740 and a housing 741. Moreover, the housings 740 and 741 in a state where they are developed as illustrated in FIG. 10D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. The semiconductor device described in any of the above embodiments is provided in at least one of the housings 740 and 741. Thus, a mobile phone set with sufficiently low power consumption, in which writing and reading of data can be performed at high speed and data can be stored for a long time, can be realized.

FIG. 10E illustrates a digital camera, which includes a main body 761, a display portion 767, an eyepiece 763, an operation switch 764, a display portion 765, a battery 766, and the like. The semiconductor device described in any of the above embodiments is provided in the main body 761. Thus, a digital camera with sufficiently low power consumption, in which writing and reading of data can be performed at high speed and data can be stored for a long time, can be realized.

Figure 10F:
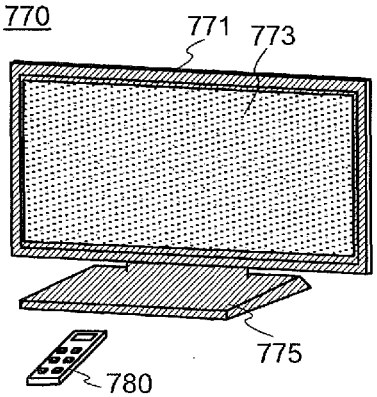

FIG. 10F is a television set 770, which includes a housing 771, a display portion 773, a stand 775, and the like. The television set 770 can be operated with a switch included in the housing 771 or with a remote controller 780. The semiconductor device described in any of the above embodiments is mounted in the housing 771 and the remote controller 780. Thus, a television set with sufficiently low power consumption, in which writing and reading of data can be performed at high speed and data can be stored for a long time, can be realized.

As described above, the electronic devices described in this embodiment each include the semiconductor device according to any of the above embodiments. Therefore, electronic devices with low power consumption can be realized.

This application is based on Japanese Patent Application serial no. 2010-111939 filed with Japan Patent Office on May 14, 2010, the entire contents of which are hereby incorporated by reference.

What is claimed is:

1. A semiconductor device comprising:
 a memory cell comprising:
  a first channel formation region comprising silicon;
  a first gate electrode over the first channel formation region with a first gate insulating layer located therebetween;
  an insulating layer over the first channel formation region;
  a second channel formation region over the insulating layer, the second channel formation region comprising an oxide semiconductor;
  a second gate electrode overlapping with the second channel formation region with a second gate insulating layer located therebetween;
  a source electrode electrically connected to the second channel formation region; and
  a drain electrode electrically connected to the second channel formation region;
  wherein one of the source electrode and the drain electrode is electrically connected to the first gate electrode,
 a first circuit comprising:
  a switch element; and
  an amplifier circuit whose output terminal is electrically connected to the other one of the source electrode and the drain electrode through the switch element; and
 a second circuit configured to control whether the switch element is turned on or off.

2. The semiconductor device according to claim 1, wherein the first channel formation region comprises single crystal silicon.

3. The semiconductor device according to claim 1, wherein the second circuit is configured to control whether the switch element is turned on or off at a frequency of once every $10^3$ seconds, or once every more than $10^3$ seconds.

4. The semiconductor device according to claim 1, wherein the oxide semiconductor comprises indium, gallium and zinc.

5. The semiconductor device according to claim 1, wherein the oxide semiconductor is an In—Ga—Zn—O-based oxide semiconductor.

6. The semiconductor device according to claim 1, wherein an off-state current of a transistor comprising the second channel formation region is $10 \times 10^{-21}$ A or less at a temperature of 25° C.

7. The semiconductor device according to claim 1, wherein the one of the source electrode and the drain electrode is electrically connected to a region of the first gate electrode exposed by chemical mechanical polishing.

8. A semiconductor device comprising:
 a first memory cell and a second memory cell each comprising:
  a first channel formation region comprising silicon;
  a first gate electrode over the first channel formation region with a first gate insulating layer located therebetween;
  an insulating layer over the first channel formation region;
  a second channel formation region over the insulating layer, the second channel formation region comprising an oxide semiconductor;
  a second gate electrode overlapping with the second channel formation region with a second gate insulating layer located therebetween;
  a source electrode electrically connected to the second channel formation region; and
  a drain electrode electrically connected to the second channel formation region;
  wherein one of the source electrode and the drain electrode is electrically connected to the first gate electrode,
 a first circuit comprising:
  a switch element; and
  an amplifier circuit whose output terminal is electrically connected to the other one of the source electrode and the drain electrode of the first memory cell and the other one of the source electrode and the drain electrode of the second memory cell through the switch element; and
  a second circuit configured to control whether the switch element is turned on or off.

9. The semiconductor device according to claim 8, wherein the first channel formation region comprises single crystal silicon.

10. The semiconductor device according to claim 8, wherein the second circuit is configured to control whether the switch element is turned on or off at a frequency of once every $10^3$ seconds, or once every more than $10^3$ seconds.

11. The semiconductor device according to claim 8, wherein the oxide semiconductor comprises indium, gallium and zinc.

12. The semiconductor device according to claim 8, wherein the oxide semiconductor is an In—Ga—Zn—O-based oxide semiconductor.

13. The semiconductor device according to claim 8, wherein an off-state current of a transistor comprising the second channel formation region is $10 \times 10^{-21}$ A or less at a temperature of 25° C.

14. The semiconductor device according to claim 8, wherein the one of the source electrode and the drain electrode is electrically connected to a region of the first gate electrode exposed by chemical mechanical polishing.

15. A semiconductor device comprising:
    a memory cell comprising:
        a first channel formation region comprising silicon;
        a first gate electrode over the first channel formation region with a first gate insulating layer located therebetween;
        an insulating layer over the first channel formation region;
        a second channel formation region over the insulating layer, the second channel formation region comprising an oxide semiconductor;
        a second gate electrode overlapping with the second channel formation region with a second gate insulating layer located therebetween;
        a source electrode electrically connected to the second channel formation region; and
        a drain electrode electrically connected to the second channel formation region;
    wherein one of the source electrode and the drain electrode is electrically connected to the first gate electrode,
    a first circuit comprising:
        a first switch element;
        a second switch element; and
        an amplifier circuit whose output terminal is electrically connected to the other one of the source electrode and the drain electrode through the first switch element and whose input terminal is electrically connected to the other one of the source electrode and the drain electrode through the second switch element; and
    a second circuit configured to control whether the first switch element is turned on or off.

16. The semiconductor device according to claim 15, wherein the first channel formation region comprises single crystal silicon.

17. The semiconductor device according to claim 15, wherein the second circuit is configured to control whether the first switch element is turned on or off at a frequency of once every $10^3$ seconds, or once every more than $10^3$ seconds.

18. The semiconductor device according to claim 15, wherein the oxide semiconductor comprises indium, gallium and zinc.

19. The semiconductor device according to claim 15, wherein the oxide semiconductor is an In—Ga—Zn—O-based oxide semiconductor.

20. The semiconductor device according to claim 15, wherein an off-state current of a transistor comprising the second channel formation region is $10 \times 10^{-21}$ A or less at a temperature of 25° C.

21. The semiconductor device according to claim 15, wherein the one of the source electrode and the drain electrode is electrically connected to a region of the first gate electrode exposed by chemical mechanical polishing.

* * * * *